US008354290B2

(12) United States Patent
Sumant et al.

(10) Patent No.: US 8,354,290 B2
(45) Date of Patent: Jan. 15, 2013

(54) ULTRANANOCRYSTALLINE DIAMOND FILMS WITH OPTIMIZED DIELECTRIC PROPERTIES FOR ADVANCED RF MEMS CAPACITIVE SWITCHES

(75) Inventors: Anirudha V. Sumant, Argonne, IL (US); Orlando H. Auciello, Lemont, IL (US); Derrick C. Mancini, Argonne, IL (US)

(73) Assignee: UChicago Argonne, LLC, Argonne, IL (US)

( * ) Notice: Subject to any disclaimer, the term of this patent is extended or adjusted under 35 U.S.C. 154(b) by 70 days.

(21) Appl. No.: 13/080,255

(22) Filed: Apr. 5, 2011

(65) Prior Publication Data

US 2012/0193684 A1 Aug. 2, 2012

Related U.S. Application Data

(60) Provisional application No. 61/321,578, filed on Apr. 7, 2010.

(51) Int. Cl.
*H01L 27/20* (2006.01)
(52) U.S. Cl. .............. 438/53; 438/50; 438/52; 257/254; 257/E21.598; 257/E27.006

(58) Field of Classification Search .................... 438/50, 438/52, 53; 257/254, E21.598, E27.006
See application file for complete search history.

(56) References Cited

U.S. PATENT DOCUMENTS

| | | | | |
|---|---|---|---|---|
| 6,127,908 A | * | 10/2000 | Bozler et al. | 333/246 |
| 6,376,787 B1 | * | 4/2002 | Martin et al. | 200/181 |
| 8,071,411 B2 | * | 12/2011 | Nabki et al. | 438/50 |

* cited by examiner

*Primary Examiner* — Thinh T Nguyen
(74) *Attorney, Agent, or Firm* — Thomas W. Tolpin; Tolpin & Partners, PC

(57) ABSTRACT

An efficient deposition process is provided for fabricating reliable RF MEMS capacitive switches with multilayer ultrananocrystalline (UNCD) films for more rapid recovery, charging and discharging that is effective for more than a billion cycles of operation. Significantly, the deposition process is compatible for integration with CMOS electronics and thereby can provide monolithically integrated RF MEMS capacitive switches for use with CMOS electronic devices, such as for insertion into phase array antennas for radars and other RF communication systems.

7 Claims, 15 Drawing Sheets

Fig. 1
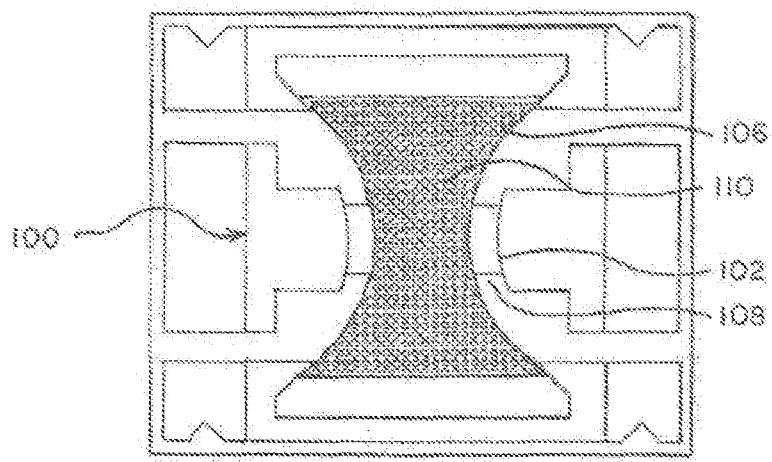
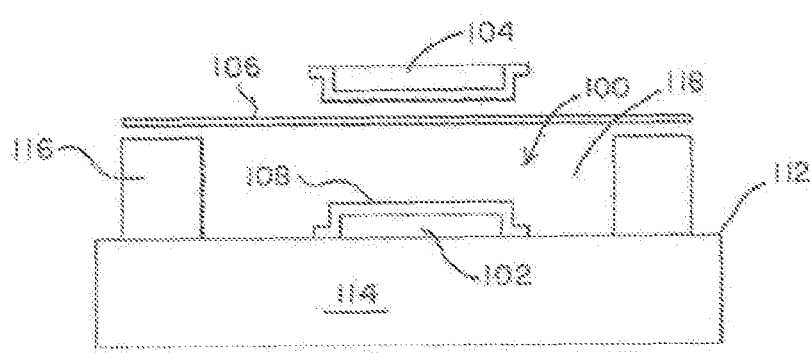
Fig. 2

2% H₂ IN PLASMA

6% H₂ IN PLASMA

ULTRANANOCRYSTALLINE DIAMOND FILMS WITH OPTIMIZED DIELECTRIC PROPERTIES FOR ADVANCED RF MEMS CAPACITIVE SWITCHES

STATEMENT REGARDING FEDERALLY SPONSORED RESEARCH OR DEVELOPMENT

The United States Government has rights in this invention pursuant to Contract No. DE-ACO2-06CH11357 between the U.S. Department of Energy (DOE) and UChicago Argonne, LLC representing Argonne National Laboratory and pursuant to Contract No, MIPR06-W238 between the Defense Advanced Research Projects Agency (DARPA) and UChicago Argonne, LLC representing Argonne National Laboratory.

BACKGROUND OF THE INVENTION

This invention relates to capacitive switches and more particularly, to radio frequency (RF) microelectromechanical systems (MEMS) capacitive switches and a fabrication process therefore.

RF MEMS capacitive switches have many useful applications for military and commercial RF and microwave applications, RF MEMS capacitive switch comprises a movable metal membrane suspended above a lower electrode and an interposing dielectric layer. An air gap of several microns typically separates the upper membrane from the dielectric layer. The lower electrode comprises a RF signal path, while the upper electrode comprises a RF and DC ground. In the switch "off state", the air gap between the membrane and lower electrode is sufficient that the upper membrane has an insignificant parasitic capacitance relative to the operating frequency of the switch. When a voltage is applied across the upper and lower electrodes, the electrostatic force pulls the membrane down into contact with the dielectric layer ("on state"). Without a significant air gap, the upper metal membrane, insulator layer, and lower metal electrode form an MIM (metal-insulator-metal) capacitor. This capacitor is designed to achieve sufficient capacitive conductance such that it can capacitively couple, or even short, the RF signal path of the lower electrode to the grounded upper metal membrane. When the applied voltage is released, the restoring force of the membrane metal spring is sufficient to return the membrane to its "off state".

Electronic switching devices comprise radio frequency microelectromechanical systems (RF MEMS) have many potential benefits over conventional semiconductor devices for controlling and routing microwave and millimeter-wave signals. RF MEMS switches possess very low insertion loss, miniscule power consumption, and ultrahigh linearity. These characteristics make MEMS switches ideal candidates for incorporation into passive circuits, such as phase shifters or tunable filters, for implementation in communications and radar systems at 1 GHz and above.

Despite the excellent RF performance of these devices, their acceptance in industry has been limited by a lack of reliability. In a well-engineered MEMS switch, dielectric charging is the main limitation to lifetime, as opposed to mechanical effects. When the switch actuates, a relatively high voltage (30-50 volts) is applied across a relatively thin switch insulator. The resulting electric field induces charge tunneling into the insulator, where they trapped. As these charges build up, they shift the pull-in and release voltages of the switch. If enough charges become trapped, the operating voltages will shift sufficiently such that the switch will either remain stuck down, or not actuate when desired. In either case, the switch fails to operate properly.

Furthermore, while the RF performance of these devices can be exemplary, reliability issues have limited their deployment into fielded systems, in the case of capacitive MEMS switches, shortcomings relating to dielectric charging have been difficult to mitigate. There are many solutions for lessening the impact of dielectric charging, including hermetic packaging, minimizing the electric field across the dielectric, and tailoring the polarity and waveform of bias control signals to minimize charging. These solutions have provided significant improvements in reliability, but have not proven enough to overcome the "stigma" associated with dielectric charging.

Commercially available RF switches use silicon dioxide ($SiO_2$) or silicon nitride ($Si_3N_4$) as a dielectric layer material in a capacitive switch. Charges become trapped in the layer and charge builds over time. As the charge builds, the operation of the device degrades until it fails. In fact, it fails very slowly. Studies have shown that the charge and discharge time constants for these materials are on the order of 10s of seconds to 100s of seconds. After failure, a device may take days to recover because charges trapped in the dielectric layer take so long to recombine at the metal electrodes of the capacitor. The amount of charge accumulated is exponentially related to the applied electric field. The higher the operating voltages, the longer the switches are left in the "on state". Furthermore, the higher the operating temperature, generally the faster the switch will fail.

More specifically, conventional prior art capacitive switches with oxide or nitride dielectric layers are chosen or designed such that the charges accumulate as slowly as possible. Conventional prior switches slowly degrade until the point of failure. Switches with oxide or nitride dielectrics also possess inherently long discharging time constants. Charging and discharging time constants are approximately equal. Therefore, once failure has occurred, conventional prior art devices are not available for proper operation for a very long time period, rendering the device essentially useless for a majority of applications and uses.

The primary failure mode of conventional prior art RF MEMS capacitive switches is accumulation of electrically charged particles within the insulator layer made of silicon oxide or silicon nitride materials of the switch, in which charges tunnel into and become trapped within the dielectric. The conventional prior art RF MEMS capacitive switch only recovers from this failure after a sufficiently long period of time (hours to days) during which the trapped charges can diffuse or migrate back to the metal electrodes. However, for practical purposes, conventional prior art RF MEMS capacitive switches often fail since the membrane remains stacked to the dielectric layer covering the bottom electrode.

Several techniques have been developed to mitigate the effects of dielectric charging on switch reliability, such as minimizing the operating conditions that lead to dielectric charging, for example, time, voltage, temperature; however, the designer does not often have control over these parameters. Alternatively, design modifications can be made to the switch to enable more reliable operation. One alternative is to minimize the amount of dielectric material within the switch to form a mechanical support of the membrane layer. The dielectric insulating material is patterned into "posts" which support the membrane, but minimize the amount of contact between the dielectric and membrane. Instead of a metal-insulator-metal capacitive switch, it is more properly described as a metal-air-metal switch. This modification trades capacitance ratio (ratio of on capacitance to off-capacitance) for improved reliability.

An alternative method of reducing dielectric charging is to engineer the chemical makeup of the dielectric such that it is conductive, or leaky. Given sufficient conduction within the dielectric, the trapped charges will have more opportunity to recombine in the device current, and thereby be eliminated. However, depending on the physics of the particle charging and discharging, the quiescent current may not always be the proper mechanism for causing the induced charges to dissipate, in which the quiescent current provides no substantial advantage.

There have been attempts to manipulate the bulk conductivity of the dielectric film to bleed off charges and improve reliability. Unfortunately, these techniques have not proven repeatable or sufficient enough to be generally adopted.

Use of diamond or diamond-like carbon (DLC) films as a dielectric for RF MEMS capacitive switches has been suggested. Nanocyrstalline diamond film can be grown using a bias enhanced nucleation (BEN) process at a high temperature (700° C.). Tetrahedral amorphous carbon (ta-C) film can be fabricated for use as a dielectric layer in RF MEMS capacitive switch with improved dielectric properties. However, the diamond-like carbon (DLC) films exhibit high as-grown stress and need to be annealed above 600° C. to release relieve internal stress. Since both BEN grown diamond and DEC films mentioned above involve high temperature processing either during growth or after deposition, they are not compatible for integration with complementary metal-oxide-semiconductors (CMOS) electronics and, therefore, their usefulness is limited, since they cannot be used to fabricate monolithically integrated RF MEMS switches with CMOS devices, which is the ultimate device architecture of interest to manufacturers, who want these integrated devices for insertion into phase array antennas for radars and other RF communication systems. The dielectric properties of ultrananocrystalline diamond (UNCD) films grown at high temperatures have been studied before. However, no reports have been published to date on tuning the dielectric properties of UNCD grown at low temperatures compatible with the CMOS thermal budget, which provides the total amount of energy transferred to a wafer at a given elevated temperation operation (such as ~400° C.) and their use in RF MEMS switches.

Furthermore, the typical thickness of the dielectric layer is a few 100s of nm and it is challenging to deposit such a thin diamond film without any pin-holes.

It is, therefore, desirable to provide an improved RF MEMS capacitive switch and fabrication process therefore, which overcomes most, if not all of the preceding problems.

BRIEF SUMMARY OF THE INVENTION

An improved RF MEMS capacitive switch and fabrication process therefore is provided for use in controlling, routing, and tuning RF wireless circuits and systems, as well as for other uses and applications. Advantageously, the improved RF MEMS capacitive switch is reliable, effective and efficient. Significantly, the fabrication process is compatible thr integration with complementary metal-oxide-semiconductors (CMOS) electronics and thereby can provide monolithically integrated RF MEMS switches for use with CMOS electronic devices, such as for insertion into phase array antennas for radars and other RF communication systems.

RF MEMS capacitive switches incorporating ultrananocrystalline diamond (UNCD) dielectric films integrated, with CMOS can provide orders of magnitude better switching performance and higher durability in harsher environments. RF MEMS capacitive switch offer significantly greater performance for military and commercial communications applications.

This invention provides multiple layers ultrananocrystalline diamond (UNCD) as a dielectric for reliable operation of radio frequency microelectromechanical systems (RF MEMS) capacitive switches. More particularly, the insulating layers on top of the electrode within the RF MEMS capacitive switch are dielectric films with electrical leaky characteristics that has properties optimized to enable a reliable, long-life, such as over 1-200 billion cycles of operation of the RF MEMS capacitive switch. The material used as a dielectric with controlled leakage in the RF MEMS capacitive switch is specially fabricated ultrananocrystalline diamond (UNCD) thin film.

In order to fabricate the RF MEMS capacitive switch UNCD thin films as dielectric layers with controlled leakage to eliminate membrane stiction (static friction) when closing the RF MEMS capacitive switch, a unique microwave plasma chemical vapor deposition (CVD) deposition process is provided. This inventive process carefully optimizes process parameters to deposit UNCD thin films at low temperature (400-450° C.) with unique dielectric properties to enable a reliable, long-life, such as over 1-200 billion cycles of operation of the RF MEMS capacitive switch. More specifically, this inventive process involves engineering the UNCD dielectric film to have sufficiently short discharging time constants that no matter how much charges are accumulated in the dielectric layer, the RF MEMS capacitive switch will recover quickly enough so as to be available for proper operation within a relatively short time span (microseconds to tens or hundreds of microseconds).

The inventive fabrication process preferably includes a three step process for depositing UNCD films with optimized dielectric properties for use in an RF MEMS capacitive switch. The UNCD films preferably comprise multiple dielectric layers that cover the bottom electrode in the RF MEMS capacitive switch. Use of UNCD for the dielectric layers provide reliable, long life operation of the RF MEMS capacitive switch by eliminating the problem of dielectric charging which is the accumulation of charge within the dielectric layer.

The new three-step growth process for producing UNCD layers, specifically provides control of the amount of hydrogen ($H_2$) incorporated at the grain boundaries of the UNCD layers and simultaneously provides tailoring of the grain size of the individual layers grown with different amounts of $H_2$ added to the argon (Ar)/methane ($CH_4$) base gas mixture. The controlled incorporation of hydrogen (H) atoms at the grain boundaries provides controlled satisfaction of dangling bonds, which result in a dielectric layer with tailored dielectric constant and charge conduction through the grain boundaries. This produces fast charging of the layer and also quick discharge (leak) of the charges first accumulated in the dielectric layers during operation of the switch. The fast charging/discharging performance of the multilayered UNCD films provides a new paradigm in RF MEMS switch operation with fast recovery of the switch ($\leq 80$ μsec) as opposed to 10-100 sec, for conventional dielectric materials, such as silicon dioxide ($SiO_2$) or silicon nitride ($Si_3N_4$), thereby practically eliminating failure due to dielectric charging and is 5 to 6 times faster than the charge/discharge characteristics of conventional switches using $SiO_2$ and $Si_3N_4$ materials as dielectric layers.

The three layer approach not only helps to form ultra-thin films (200-300 nm) without pin-holes but also helps to control the internal stresses in the UNCD films. Additionally, chemically inert and hydrophobic nature of UNCD eliminates stiction and tribo-charging problems comprising triboelectric generation or a type of charging with the contacting metal membrane.

The fabrication technique can include a three-step process to deposit UNCD films with optimized dielectric properties.

1. The first step comprises reducing the hydrogen content by volume to 1% 2% using argon (Ar)/methane ($CH_4$)/hydrogen ($H_2$) gas chemistry in the microwave chemical vapor deposition (CVD) plasma during initial deposition period to allow rapid nucleation of UNCD and forming a continuous thin film.

2. In the second step, the $H_2$ percentage is increased to 4%-5% in the Ar/$CH_4$/$H_2$ gas chemistry in the CVD plasma to increase incorporation of $H_2$ at the grain boundary so as to help provide for the unique dielectric properties of the film.

3. in third step, the $H_2$ percentage is reduced back to the 1% 2% used in step 1 and chemical vapor deposition (CVD) is continued for a short time to complete the CVD of the thin films providing the multiple dielectric layers. This allows dense renucleation of nanodiamond and fill-in of any gaps between grains, and forms a uniform continuous layer. This 3-layer step approach not only helps to from ultra-thin films (200-300 nm) without pin-holes, but also helps to reduce overall stress and provides good dielectric properties.

The unique multilayer approach developed has been demonstrated for its integration with complementary metal-oxide-semiconductor (CMOS) and can be useful in reducing overall compressive stress in UNCD film, which can improve the overall yield of the devices, which is subjected to stringent processing conditions during micro-fabrication of RF MEMS capacitive switches.

Preferably, the improved process for use in fabricating a RF MEMS capacitive switch, comprises: providing a bottom electrode; and layering ultrananocrystalline diamond (UNCD) on the bottom electrode to provide a multilayered UNCD dielectric film having electrical leaky characteristics on the bottom electrode for fast dielectric charging and discharging and rapid recovery of the RF MEMS capacitive switch. Advantageously, the layering comprises depositing layers of UNCD by microwave plasma chemical vapor deposition (CVD) with microwave CVD plasma. The preferred process includes: forming a layer of substantially continuous dielectric film with rapid nucleation of UNCD by decreasing hydrogen ($H_2$) content of the microwave CVD plasma; thereafter increasing hydrogen ($H_2$) concentration in a grain boundary of an intermediate layer of the dielectric film by increasing hydrogen ($H_2$) content of the microwave CVD plasma to form a high resistivity layer of film with a hydrogen-enriched grain boundary; and subsequently decreasing hydrogen ($H_2$) content of the microwave CVD plasma for dense renucleation of the UNCD for filing in gaps or pinholes between grains and forming a substantially uniform continuous layer. The microwave CVD plasma can comprises argon ($A_R$), methane ($CH_4$) and hydrogen ($H_2$).

The fabrication process can include reducing stress in the dielectric film, placing a membrane above the dielectric film and positioning an upper electrode above the membrane. Advantageously, the RF MEMS capacitive switch is fabricated and designed to operate for at least 45 million cycles when driven by a CMOS electronic device.

A more detailed explanation of the invention is provided in the following detailed descriptions and appended claims taken in conjunction with the accompanying drawings.

BRIEF DESCRIPTION OF THE DRAWINGS

FIG. 1 is a top plan view of a RF MEMS capacitive switch in accordance with principles of the present invention.

FIG. 2 is a cross-sectional view of the RF MEMS capacitive switch,

DETAILED DESCRIPTION OF THE INVENTION

Figure 3A:
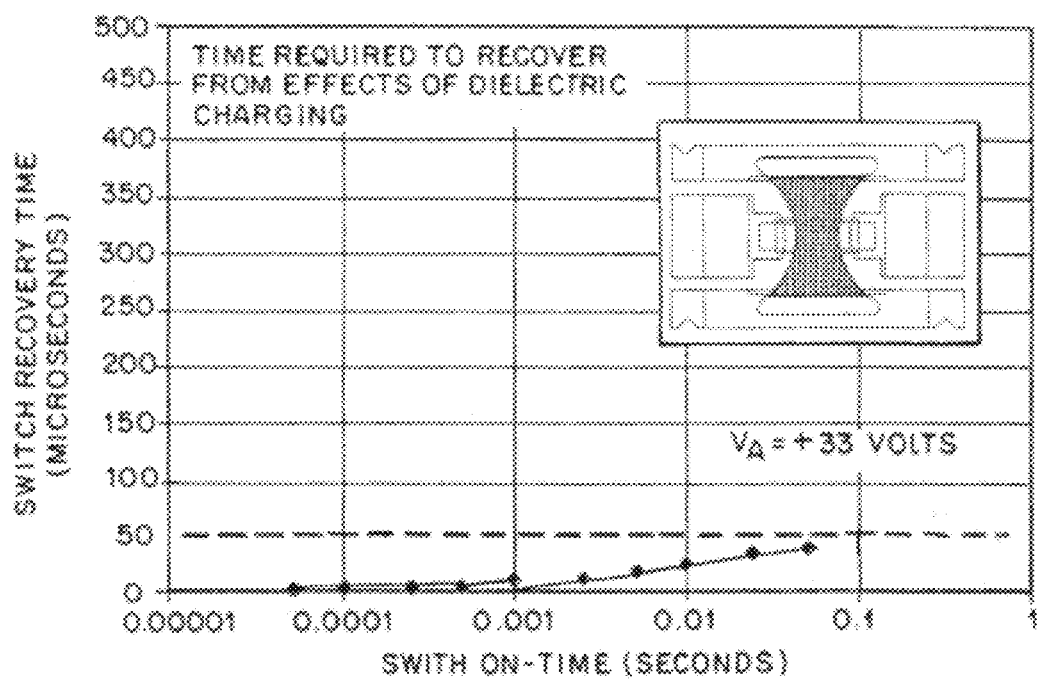
FIG. 3 is a diagram and chart illustrating discharge data for the RF MEMS capacitive switch.

The following is a detailed description and explanation of the preferred embodiments of the invention and best modes for practicing the invention.

Referring to the drawings, a radio frequency (RF) microelectromechanical (MEMS) capacitive switch 100 (FIGS. 1 and 2) is moveable for a switching time from an off position in an off state to an on position in an on state. The RF MEMS capacitive switch can have: a bottom electrode 102 comprising metal that provides a RF signal path; a top electrode 104 comprising an RF ground and a direct current (DC) ground; a moveable metallic membrane 106, and multiple layered (multi-layered) dielectric films 108 with electrical leaky characteristics and providing multiple dielectric insulating layers on the bottom electrode. The RF MEMS capacitive switch can also have undercut access holes 110. The RF MEMS capacitive switch can have a substrate 112, such as a silicon on sapphire (SOS) substrate 114, positioned below the bottom electrode and can have at least one post 116 that extends between the membrane and the substrate. Advantageously, the RF MEMS capacitive switch can comprise a reliable long-life switch that is operable for more than 100 billion cycles.

In the preferred embodiment, the moveable metallic membrane comprises molybdenum (MO) and has high conductivity, low resistance and is mechanically robust. The membrane can be less than 0.4 μm thick and can be spaced from the bottom electrode by an air gap 118 of about 2 microns to about 10 microns resulting in a substantially insignificant capacitance relative to an operating frequency of the switch. In use, the membrane contacts the dielectric film when a voltage of about 30 volts to about 50 volts is applied across the top and bottom electrodes in the on state. Desirably, the membrane cooperates with the insulating layer and the bottom electrode to form a metal-insulator-metal (MIM) capacitor 120 (FIG. 35) in the on state.

Advantageously, the RF MEMS capacitive switch can be monolithically integrated with one or more complementary metal-oxide-semiconductors (CMOS) electronic devices 122 (FIGS. 13, 14, 16, 27, 28, and 33). Co-integration with CMOS makes RF MEMS capacitive switch more user friendly and can also vastly improve life testing and lifetime with intelligent control electronics. Monolithically integrated RF MEMS switches can be used with CMOS electronic devices, such as for insertion into phase array antennas for radars and other RF communication systems. RF MEMS capacitive switches incorporating ultrananocrystalline diamond (UNCD) dielectric films integrated with CMOS can provide orders of magnitude better switching performance and higher durability in harsher environments, RF MEMS capacitive switches offer significantly greater performance for military and commercial communications applications.

In the preferred embodiment, the dielectric films comprise ultrananocrystalline diamond (UNCD) substantially without pinholes, gaps, voids. The dielectric films preferably have a discharging and recovery time substantially less than the switching time for substantially discharging an accumulated charge within 50 microseconds. In the illustrative embodiment, the dielectric films provides dielectric layers which provides leaky dielectric layers with a charging time constant of about 100 microseconds.

Use of UNCD provides controlled leakage and allows reliable, long life operation of the RF MEMS capacitive switch by eliminating the problem of dielectric charging which is the accumulation of charge within the dielectric layer. The UNCD dielectric material of the RF MEMS capacitive switch has charge and discharge time constants that are on the order of microseconds to 10s of microseconds instead of 100s of seconds for conventional RF MEMS capacitive switches with an insulating layer of silicon dioxide ($SiO_2$) or silicon nitride ($Si_3N_4$). UNCD films have unique charging properties with a very fast time constant which allow longer lifetimes that possible with traditional dielectrics.

Figure 6:
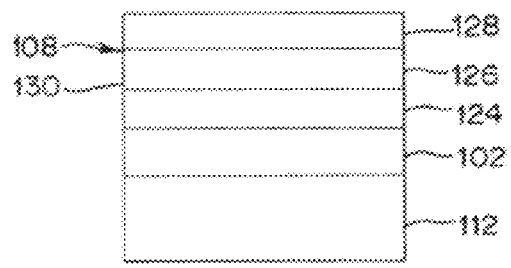
FIG. 6 is a diagram and chart illustrating the new layered ultrananocrystalline diamond (UNCD) synthesis approach.

As shown in FIG. 6, the multi-layer dielectric films comprising ultrananocrystalline diamond (UNCD) preferably include: (1) a bottom UNCD layer 124 which provides a lower ultra thin film that covers a substantial area of the upwardly facing portion of the bottom electrode; (2) an intermediate UNCD layer 126 on the bottom UNCD layer that provides a middle ultra thin film and a high resistivity film, and (3) an upper UNCD layer 128 that provide atop ultra thin film on the intermediate UNCD layer. The intermediate UNCD layer preferably has a hydrogen enriched grain boundary 130 for enhanced charge conduction.

In the illustrative embodiment, the bottom electrode comprises tungsten (W) or a stack comprising chromium (chrome) (Cr), tungsten and chromium so as to accommodate high temperature UNCD deposition.

Desirably, the inventive RF MEMS capacitive switch recovers quickly enough for the switch to be available for operation after only a short (in microseconds) interruption followed by a rapid recovery before normal operation. Advantageously, UNCD has low stiction properties, is chemically inert, hydrophobic, and reduces problems related to tribological interaction of metal membrane with dielectric material.

The process for fabricating a radio frequency (RF) microelectromechanical switch (MEMS) capacitive switch, can comprise the steps of: providing a substrate, placing a bottom electrode on the substrate, and depositing layers of ultrananocrystalline diamond (UNCD) thin films on the bottom electrode by microwave chemical vapor deposition (CVD) with a microwave CVD plasma gas comprising argon (Ar), methane ($CH_4$) and hydrogen ($H_2$) to form multilayered UNCD dielectric films. As shown in FIG. 6, the preferred process includes: depositing a bottom UNCD layer on the bottom electron with $H_2$ flow for rapid nucleation of the UNCD and form a substantially continuous dielectric film; depositing an intermediate UNCD layer on the bottom UNCD layer with a higher $H_2$ flow and forming a higher resistivity film with a hydrogen enriched grain boundary; and depositing an upper UNCD layer on the intermediate UNCD layer with a lower $H_2$ flow than for the intermediate UNCD layer for dense nucleation of the UNCD to fill in the gaps or pinholes between grains and forming a substantially continuous layer.

In the fabrication process, the dielectric layers can layers can be deposited at a temperature ranging from 400-500° C. with 400 sccm Ar and 1-2 sccm $CH_4$. The bottom layer can be deposited with 5-8 sccm $H_2$. The intermediate layer can be deposited with 14-16 sccm $H_2$. The upper layer can be deposited with 5-8 sccm $H_2$. The $H_2$ concentration can be increased 4-5% by volume in the microwave CVD plasma for the intermediate layer and decreased by 1-2% by volume in the microwave CVD plasma for the upper layer. The dielectric films can comprise ultra thin UNCD dielectric films ranging from 200-300 nm.

The first layer (bottom layer) with low hydrogen flow allows rapid nucleation for forming a continuous UNCD film. The second layer (intermediate layer) with higher hydrogen flow facilitates deposition of high resistivity film and high permittivity. The third layer (upper layer) at low hydrogen flow allows dense renucleation and fill-in of any gaps (pinholes). The layered UNCD approach provides good dielectric properties but also help to reduce the over stress in the film stack and provides pin-hole free, continuous UNCD films at 200-300 nm thickness. Preferably, all the UNCD layers are grown at or less than 450° C. within the CMOS thermal budget.

The fabrication process can include positioning a moveable metallic membrane above the multilayered UNCD dielectric film and positioning a top electrode above the membrane. Desirably, the fabrication process produces, forms and provides a long life RF MEMS capacitive switch with the multilayered UNCD dielectric films, membrane, electrodes and substrate so that the RF MEMS capacitive switch is operable for more than 100 billion cycles. The RF MEMS capacitive switch discharges and leaks charges accumulated in the dielectric film so that the RF MEMS capacitive switch recovers within at least 80 μsec. This process and structure substantially prevents failure of the RF MEMS capacitive switch due to dielectric charging of the films and can substantially eliminate stiction and tribo-charging problems when the RF MEMS capacitive switch is closed and the membrane contacts the dielectric film.

The preferred process can comprise fabricating a RF MEMS capacitive switch in which the membrane comprises molybdenum (Mo), the bottom electrode comprises tungsten (W) or a stack comprising chromium (chrome) (Cr), tungsten and chromium, and the bottom electrode is positioned on a substrate comprising silicon on sapphire (SOS) or a silicon wafer.

Desirably, the process can include monolithically integrating the RF MEMS capacitive switch with a complementary metal-oxide-semiconductor (CMOS) electronic device.

Figure 3B:
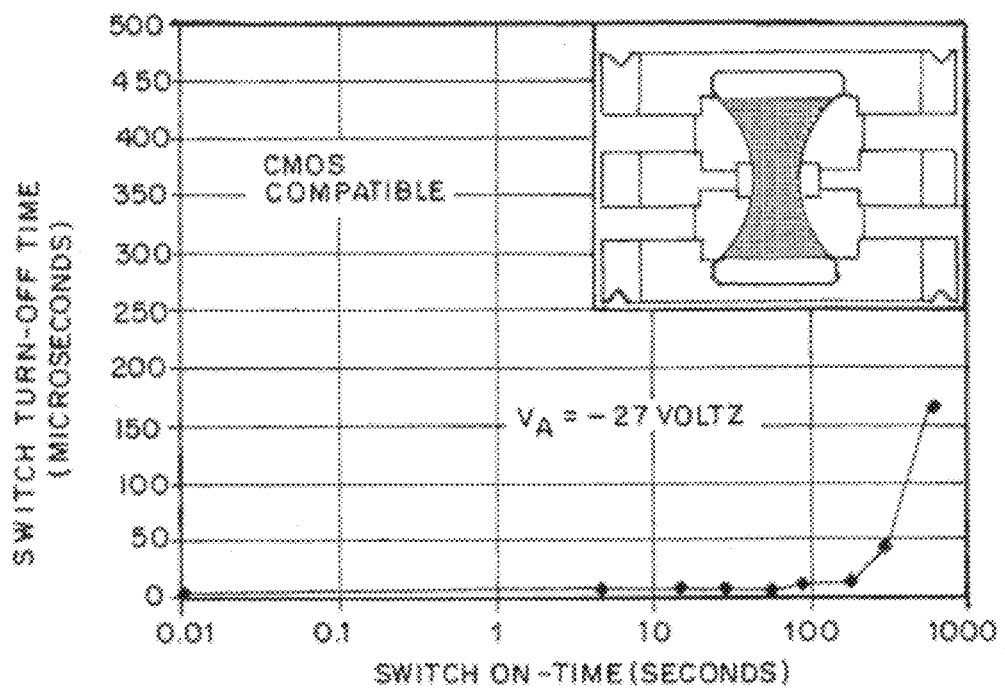

FIG. 3 is a diagram and chart illustrating discharge data for the RF MEMS capacitive switch with the UNCD dielectric layers. FIG. 3 shows that the discharge time is in the range of microseconds, which are orders of magnitude shorter than for conventional switches with a silicon dioxide ($SiO_2$) or silicon nitride ($Si_3N_4$) dielectric layer. The RF MEMS capacitive switch with the UNCD dielectric layers worked successfully for more than 1 billion cycles.

Figure 4:
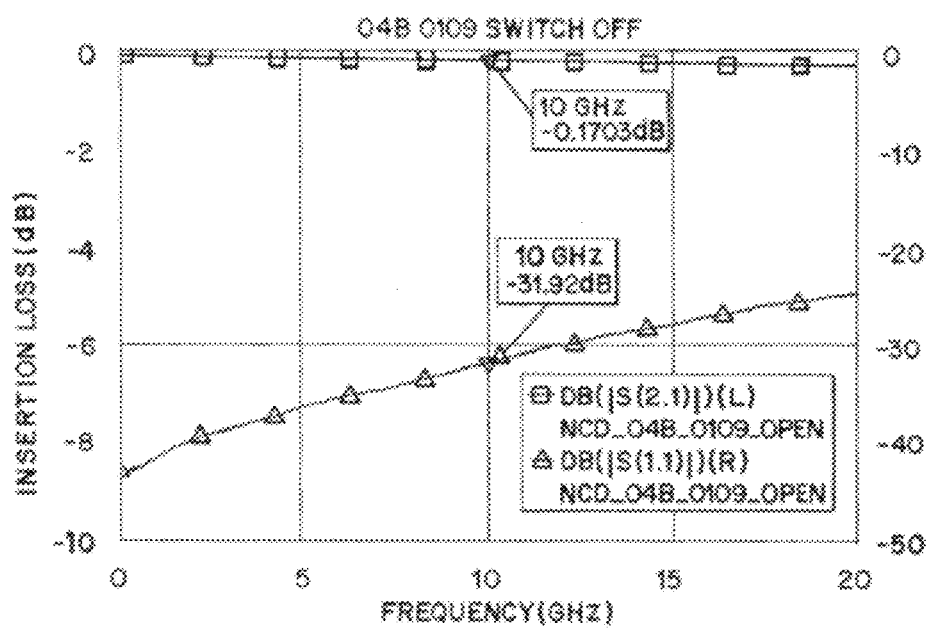
FIG. 4 is a diagram and chart illustrating open state insertion loss measurements of the RF MEMS capacitive switch.

FIG. 4 is a diagram and chart illustrating open state insertion loss measurements of the RF MEMS capacitive switch with UNCD dielectric layers. The performance was at 10 GHz and indicates an insertion loss of 0.17 dB. This is extracted from S-pars with: $C_{off}$ at −16 ff, $C_{on}$ at −644 ff, and a $C_{ration}$ of −41. The RF MEMS capacitive switch with the UNCD dielectric layers provide low loss, harsh environment, long lifetime UNCD based switches.

Figure 5:
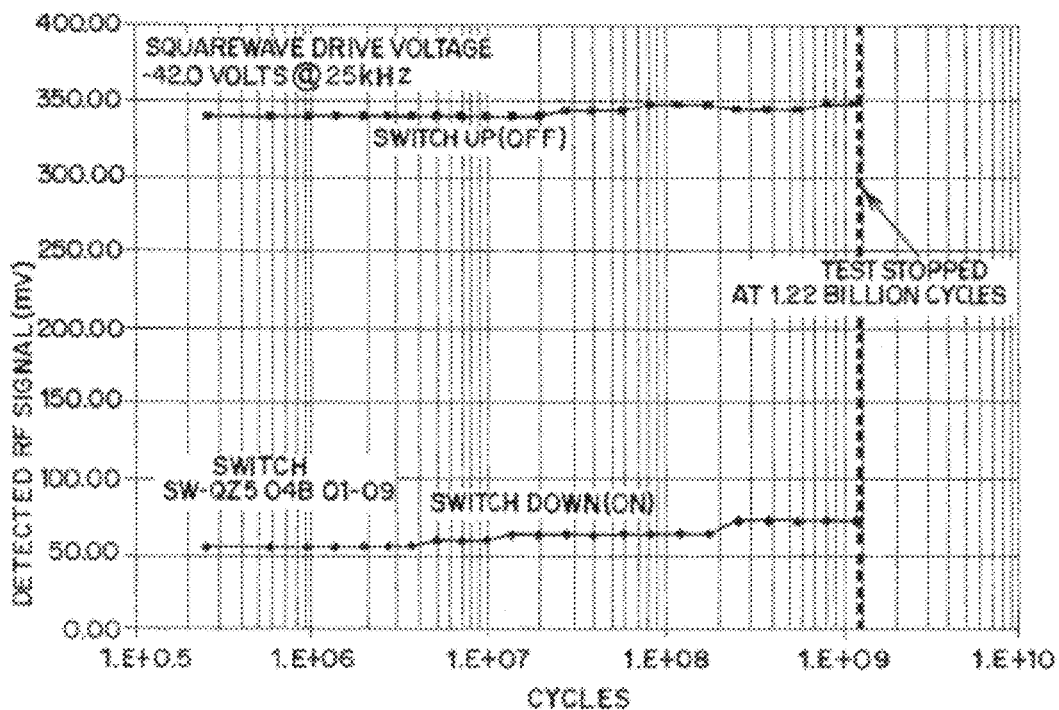
FIG. 5 is a diagram and chart illustrating a switch life-time of the RF MEMS capacitive switch.

FIG. 5 is a diagram and chart illustrating a switch life-time of the RF MEMS capacitive switch with the UNCD dielectric layers which worked successfully for more than one billion cycles.

Figure 7:
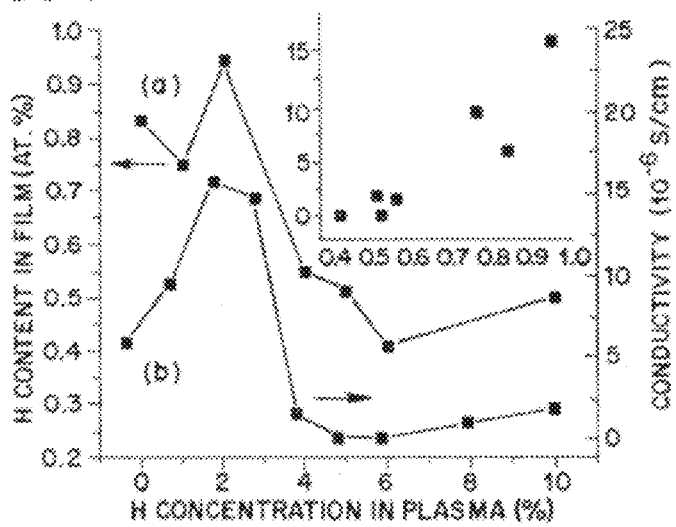
FIG. 7 is a diagram and chart illustrating the hydrogen (H) concentration in the film as a function of the H concentration in the plasma.
Figure 8:
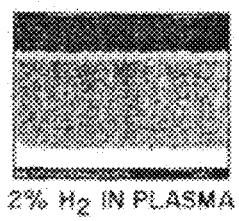
FIG. 8 is an image of 2% hydrogen ($H_2$) in the plasma.
Figure 9:
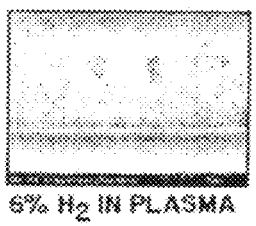
FIG. 9 is an image of 6% hydrogen ($H_2$) in the plasma.
Figure 10:
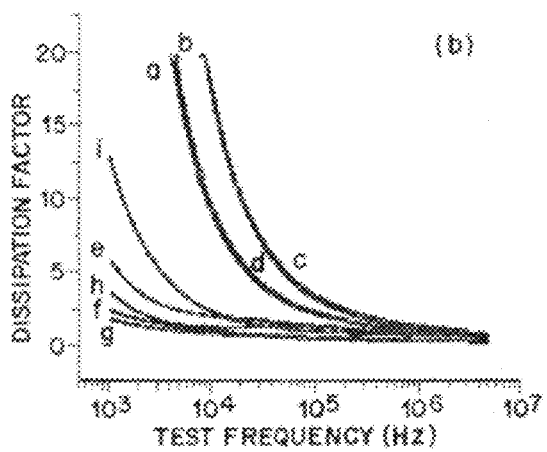
FIG. 10 is a diagram and chart illustrating the dissipation factor and test frequency.

The development of UNCD films as a leaky dielectric is shown in FIGS. 7-10. UNCD films were grown with 2% hydrogen ($H_2$) at 800° C. provide: higher volume fraction of grain boundaries, higher amount of bulk $H_2$, higher conductivity and higher dissipation. FIG. 7 is a diagram and chart illustrating the hydrogen (H) concentration in the film as a function of H concentration in the plasma. FIG. 8 is an image of 2% hydrogen ($H_2$) in the plasma. FIG. 9 is an image of 6% hydrogen ($H_2$) in the plasma. FIG. 10 is a diagram and chart illustrating the dissipation factor as a function of test frequency.

Figure 11:
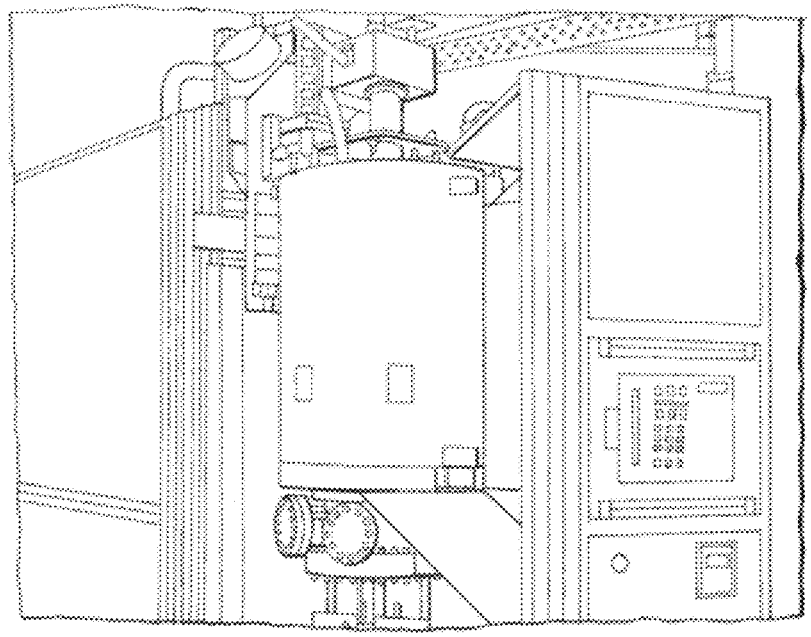
FIG. 11 is a perspective view of a microwave plasma chemical vapor deposition (MPCVD) system.
Figure 12:
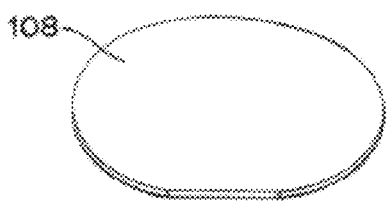
FIG. 12 is a perspective view of 400° C. ultrananocrystalline diamond (UNCD) films with ±5% thickness variation over 150 mm diameter silicon (Si) wafer.
Figure 13:
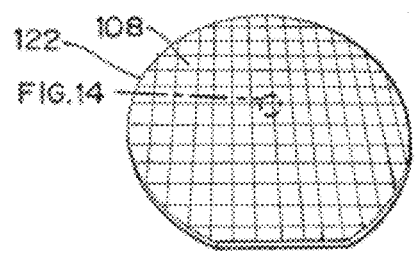
FIG. 13 is a perspective view of 400° C. UNCD film deposited on 150 mm diameter sapphire-CMOS wafer with ±5% thickness variation.
Figure 14:
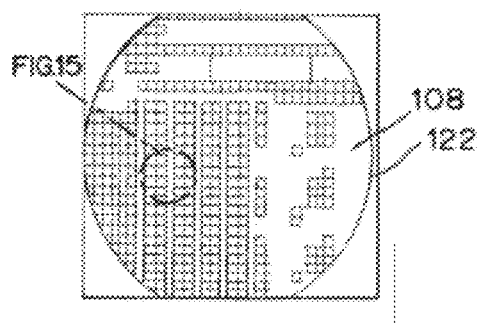
FIG. 14 is a top plan view of 400° C. UNCD film deposited on 150 mm diameter sapphire-CMOS wafer with ±5% thickness variation.
Figure 15:
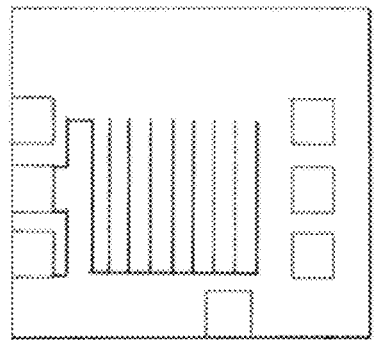
FIG. 15 is an enlarged top plan view of a portion of 400° C. UNCD film deposited on 150 mm diameter sapphire-CMOS wafer with ±5% thickness variation.
Figure 16:
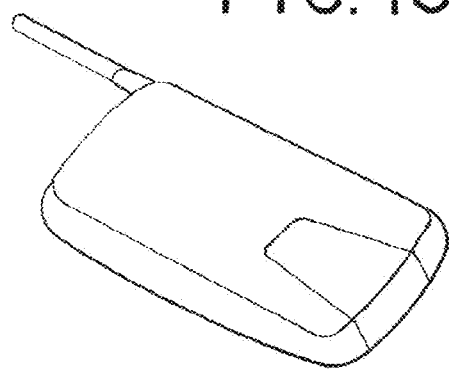
FIG. 16 is a perspective view of a wireless diamond MEMS/CMOS device, such as a mobile cellular phone.

FIG. 11 is a perspective view of a 915 MHz microwave plasma chemical vapor deposition (MPCVD) system at the Center for Nanoscale Material (CNM) at Argonne National Laboratory which was used fabricate and produce 400° C. ultrananocrystalline diamond (UNCD) films with ±5% thickness variation over 150 mm diameter silicon (Si) wafer as shown in FIG. 12 and 400° C. UNCD film deposited on 150 mm diameter sapphire-CMOS wafer with ±5% thickness variation, as shown in FIGS. 13-15.

Figure 17:
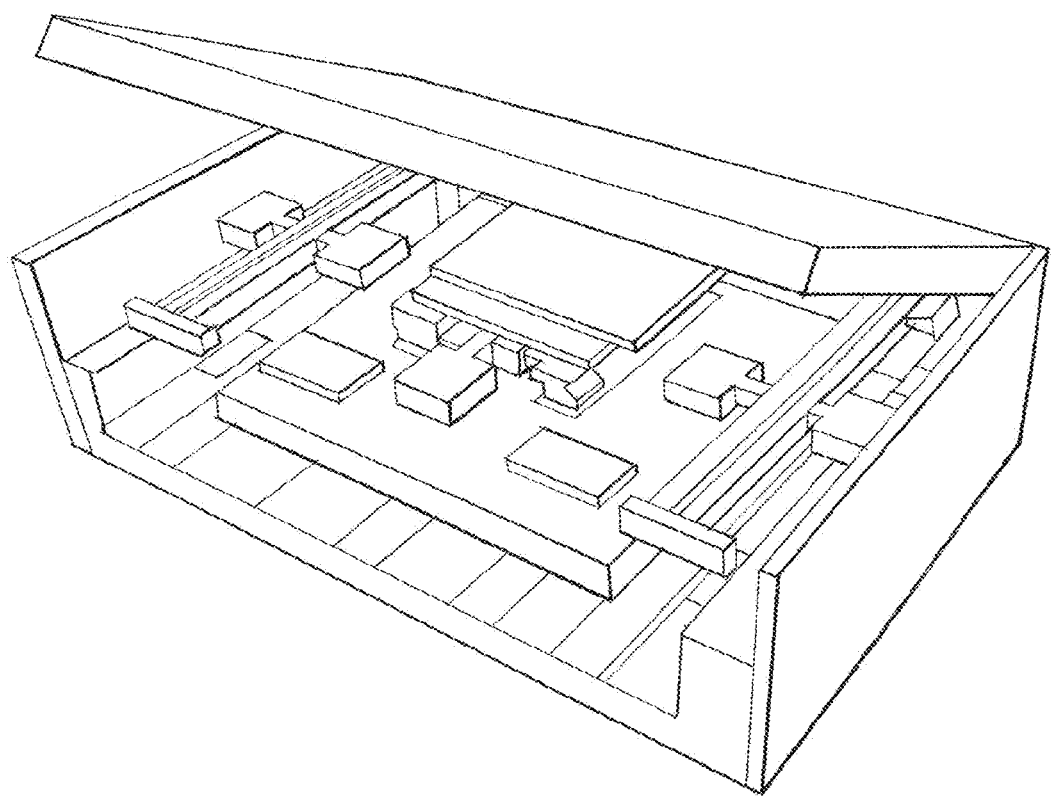
FIG. 17 is a perspective view of a high frequency, low loss, RF MEMS capacitive switch with UNCD dielectric layers monolithically integrated with CMOS compatible devices on a single chip.

FIG. 17 is a perspective view of a high frequency, low loss, RF MEMS capacitive switch with UNCD dielectric layers monolithically integrated with CMOS compatible devices on a single chip. This provides UNCD MEMS/nanoelectromechanical systems (NEMS) in which UNCD deposition can occur at 400° C. and can be useful for piezoelectically actuated diamond based switches, resonators and fillers, as well as high frequency (GHz) lower insertion loss devices for single chip mounted CMOS driven RF MEMS capacitive switches. They can be used with leverage economics of large volume in diamond MEMS/CMOS devices, such as cell phones and other wireless devices. Furthermore, they can be implemented in high performance, high reliability integrated diamond MEMS/CMOS wireless sensors and actuator devices in warfare systems and defense applications.

Figure 18:
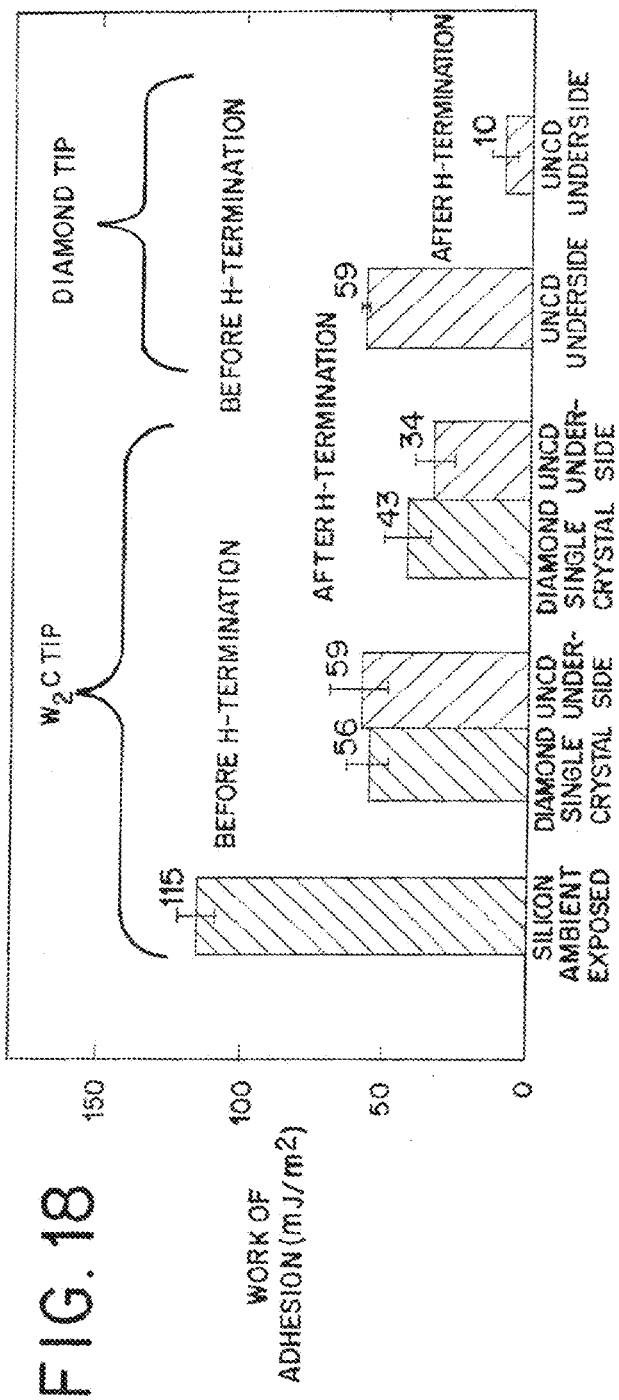
FIG. 18 is a diagram and chart illustrating effect of hydrogen (H) termination on the adhesion between different surface and tip materials including a tungsten carbon ($W_2C$) tip and a diamond tip before and after H termination.
Figure 19:
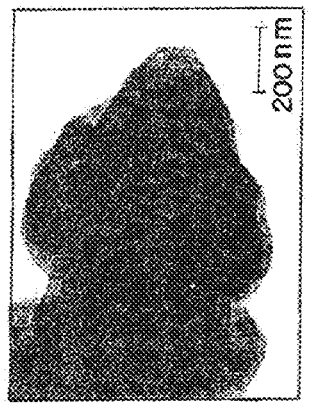
FIG. 19 is a perspective view of a diamond tip before hydrogen (H) termination.
Figure 20:
FIG. 20 is a perspective view of a diamond tip after hydrogen (H) termination.

FIG. 18 is a diagram and chart illustrating effect of hydrogen (H) termination on the adhesion between different surface and tip materials including a tungsten carbon ($W_2C$) tip and a diamond tip before and after H termination. Record low adhesion energies approaching van der Waal's limits: ≈30 mJ/m² for methyl terminated hydrocarbons FIG. 19 is a perspective view of a diamond tip before hydrogen (H) termination. FIG. 20 is a perspective view of a diamond tip after hydrogen (H) termination.

Figure 21:
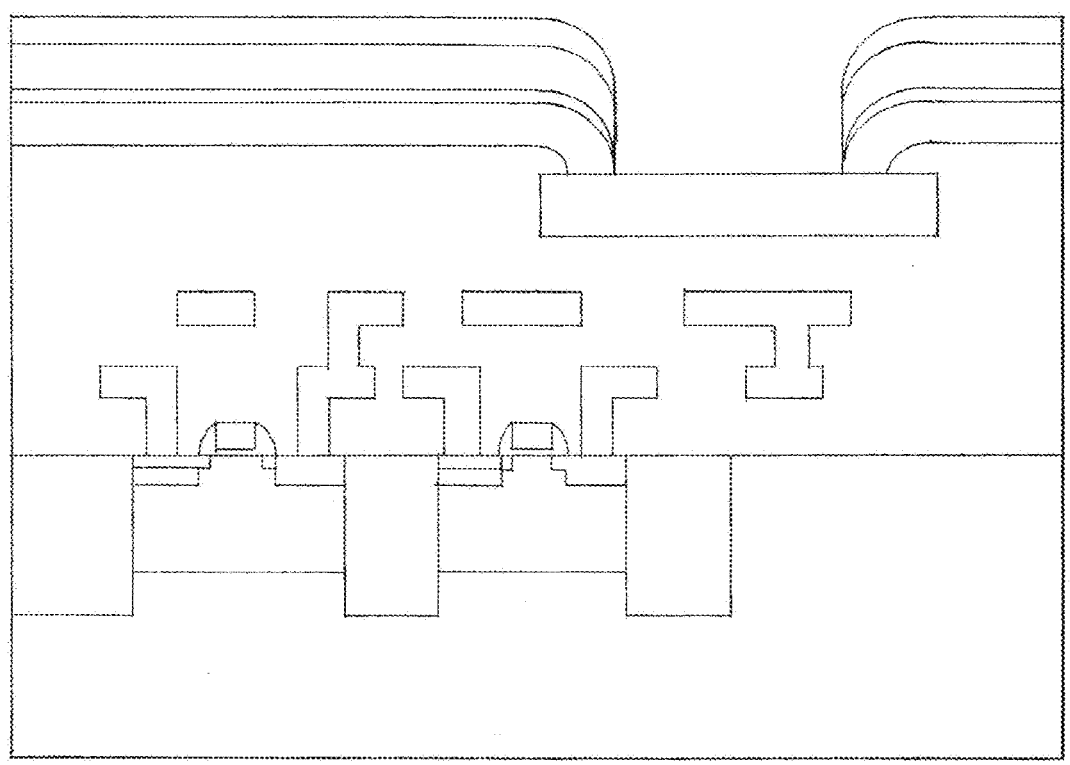
FIG. 21 is a diagram illustrating demonstration of integration of UNCD with CMOS.
Figure 22:
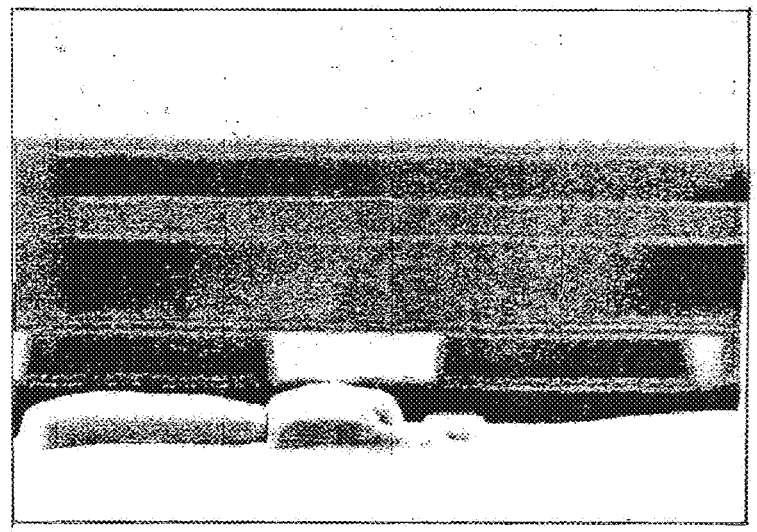
FIG. 22 is a focused ion beam (FIB) cross-section image of UNCD/CMOS.

FIG. 21 is a diagram illustrating demonstration of integration of UNCD with CMOS. A tungsten (W) layer can be used to facilitate UNCD seeding and growth. Plasma enhanced chemical vapor deposition (PECVD) silicon dioxide ($SiO_2$) can be used for isolation to avoid shortening between pads and the tungsten layer. Aluminum (Al) can be used as a hard mask for reactive ion etching (RIE) of the UNCD as well as for PECVD. Both N-type metal oxide semiconductor (NMOS) and P-type metal oxide semiconductor (PMOS)

devices were tested before and after UNCD deposition. FIG. 22 is a focused ion beam (FIB) cross-section image of the UNCD/CMOS.

Figure 23:
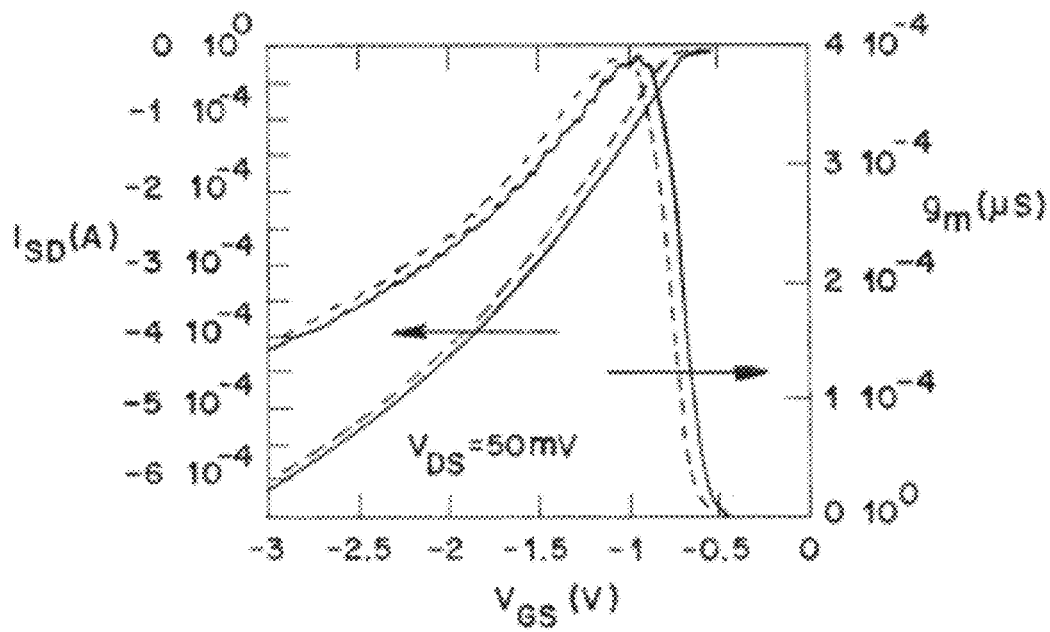
FIGS. 23-24 are diagrams and charts illustrating post UNCD characterization of P-type metal oxide semiconductor (PMOS) and N-type metal oxide semiconductor (NMOS) devices before and after UNCD deposition.
Figure 24:
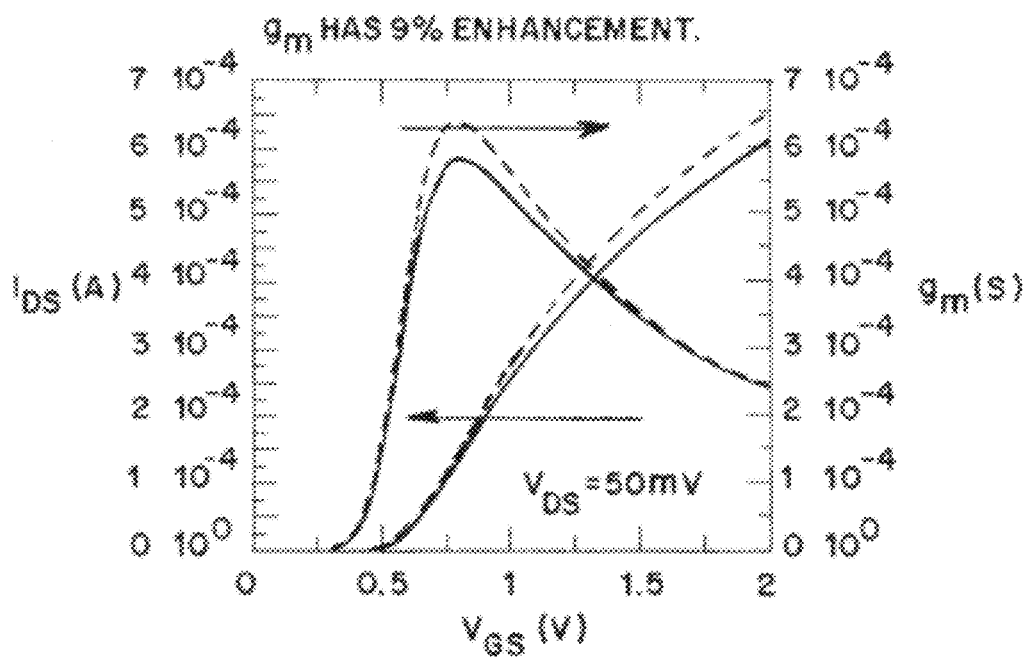

FIGS. 23-24 are diagrams and charts illustrating post UNCD characterization of P-type metal oxide semiconductor (PMOS) and N-type metal oxide semiconductor (NMOS) devices before and after UNCD deposition including an extra PECVD layer and the pad reopening process. The solid lines illustrate a fresh ship, while the dashed lines illustrate a chip with UNCD. In FIG. 23, the threshold voltage (Vth) was increased by 0.08 volts (V) and the transconductance ($g_m$) decreased by 1.5%. In FIG. 24, the threshold voltage (Vth) was increased by 0.03 volts (V) and the transconductance ($g_{in}$) decreased by 1.5%. The post UNCD CMOS was sufficient to drive on-chip integrates MEMS devices.

Figure 25:
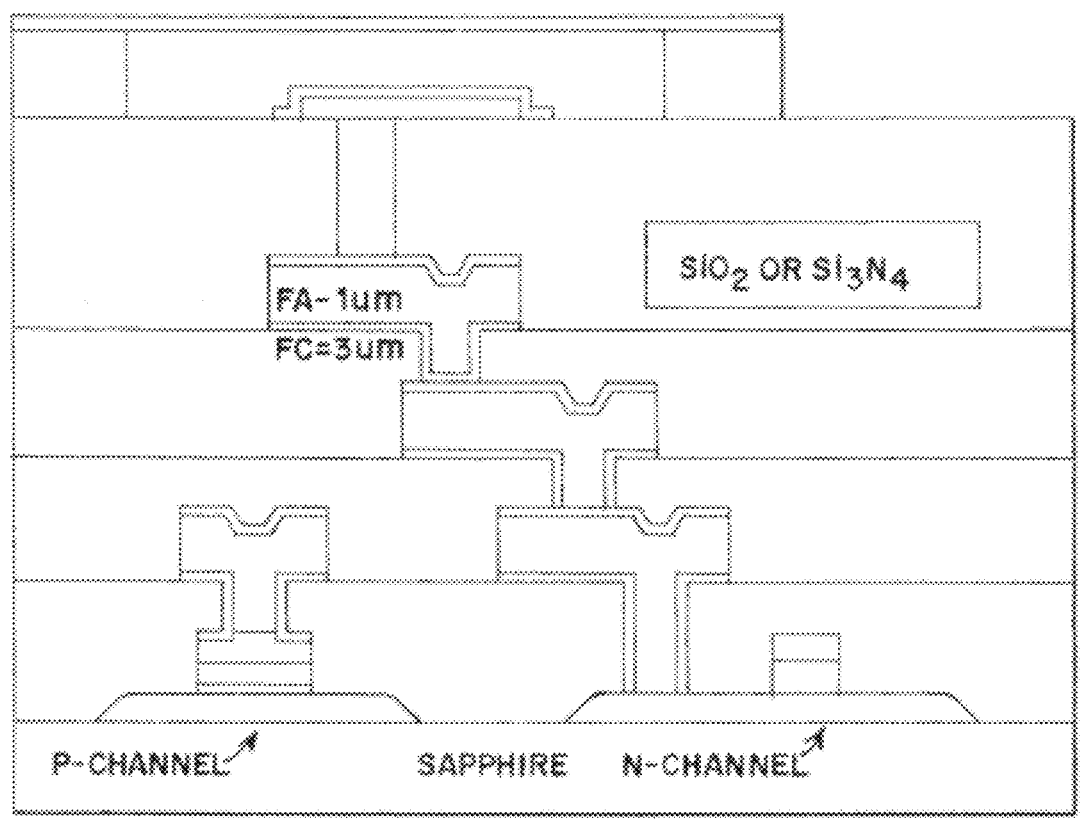
FIG. 25 is a diagram of monolithically integrated UNCD RF MEMS capacitive switches on sapphire substrates.
Figure 26:
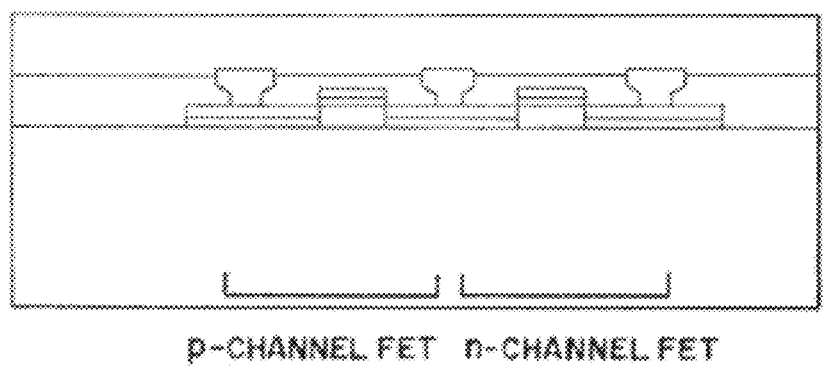
FIG. 26 is a diagram of a cross-section view of a portion of a monolithically integrated UNCD RF MEMS capacitive switch on a sapphire substrate.

FIG. 25 is a diagram of monolithically integrated UNCD RF MEMS capacitive switches on sapphire substrates. FIG. 26 is a diagram of a cross-section view of a portion of a monolithically integrated UNCD RF MEMS capacitive switch on an insulating sapphire substrate. Among the advantages of the monolithically integrated UNCD RF MEMS capacitive switches on insulating sapphire substrates are: (a) ultra CMOS eliminates parasitic capacitance due to the insulating substrate; (b) extremely fast switching due to lack of capacitance; (c) no non-linear voltage dependent capacitance; (d) no cross-talk or leakage through the substrate; and (d) enable excellent speed, linearity and isolation.

Figure 27:
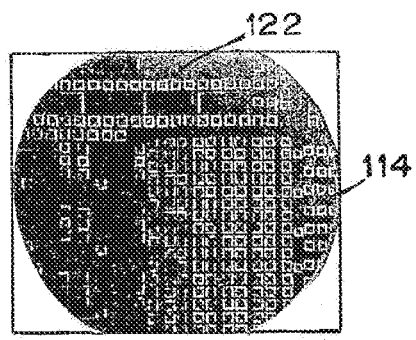
FIG. 27 is an image of CMOS on a sapphire wafer coated with UNCD and demonstrating the integration of UNCD with CMOS on sapphire.
Figure 28:
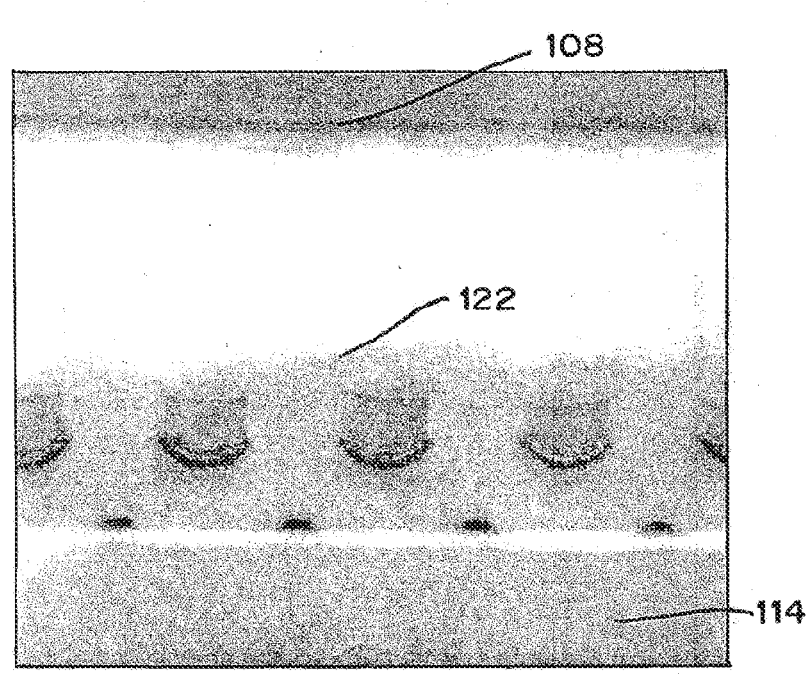
FIG. 28 is an enlarged image of CMOS on a sapphire wafer coated with UNCD and with silicon nitride ($Si_3N_4$) and platinum (Pt).
Figure 29:
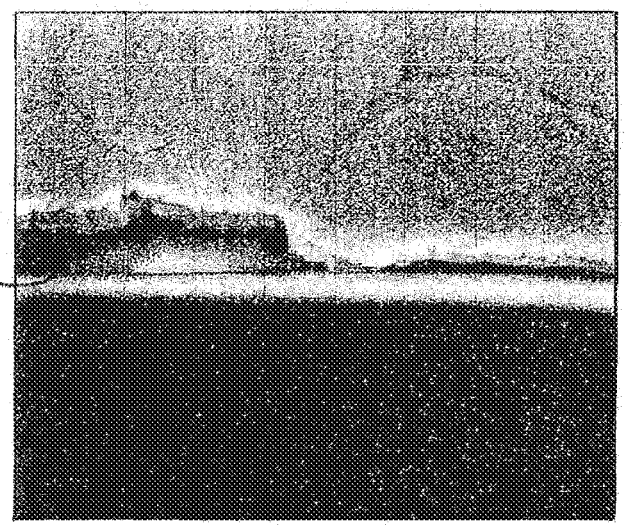
FIG. 29 is an image of UNCD with a film thickness of about 70 nm.

FIG. 27 is an image of CMOS on a sapphire wafer coated with UNCD and demonstrating the integration of UNCD with CMOS on sapphire. FIG. 28 is an enlarged image of CMOS on a sapphire wafer coated with UNCD and with silicon nitride ($Si_3N_4$) and platinum (Pt). FIG. 29 is a focused ion beam (FIB) image of UNCD with a film thickness of about 70 nm.

Figure 30:
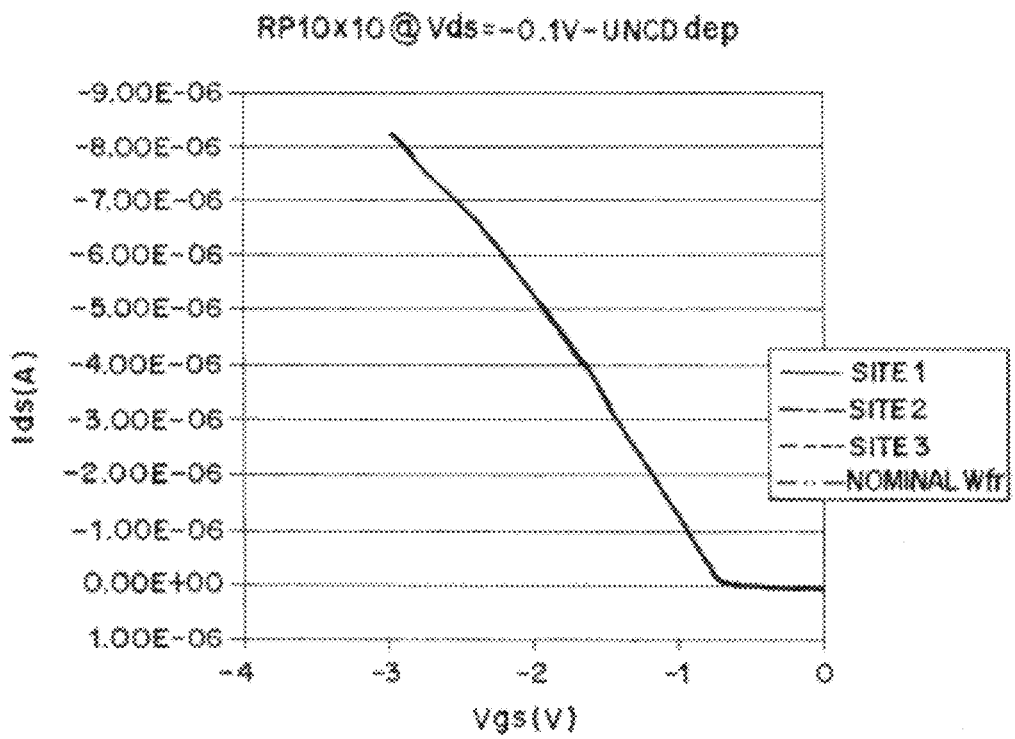
FIGS. 30-31 are further diagrams and charts illustrating post UNCD characterization of P-type metal oxide semiconductor (PMOS) and N-type metal oxide semiconductor (NMOS) devices before and after UNCD deposition.
Figure 31:
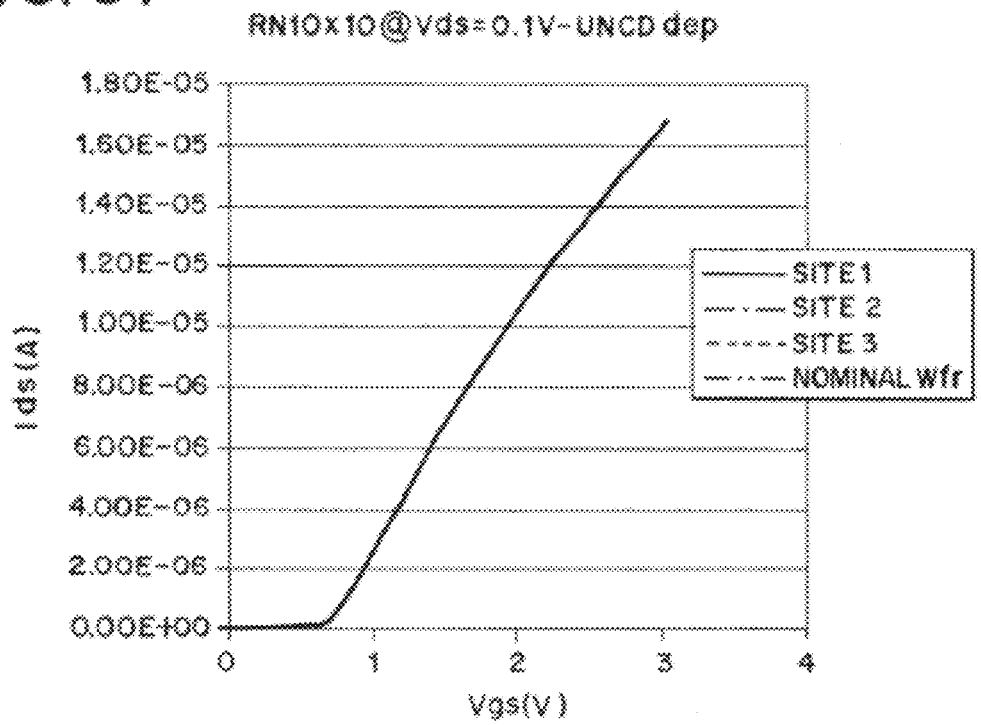

FIGS. 30-31 are further diagrams and charts illustrating post UNCD characterization of P-type metal oxide semiconductor (PMOS) and N-type metal oxide semiconductor (NMOS) devices before and after UNCD deposition. They show a significant shift in the threshold voltage after UNCD deposition and processing. The CMOS on sapphire sample without any processing was measured and taken as a control sample. Thereafter, a 10 nm thick tungsten layer was deposited. A 100 nm thick UNCD thin film was deposited followed by reactive ion etching (RIE) of the UNCD. Laser etching of the tungsten layer was done to open the pads.

Figure 32:
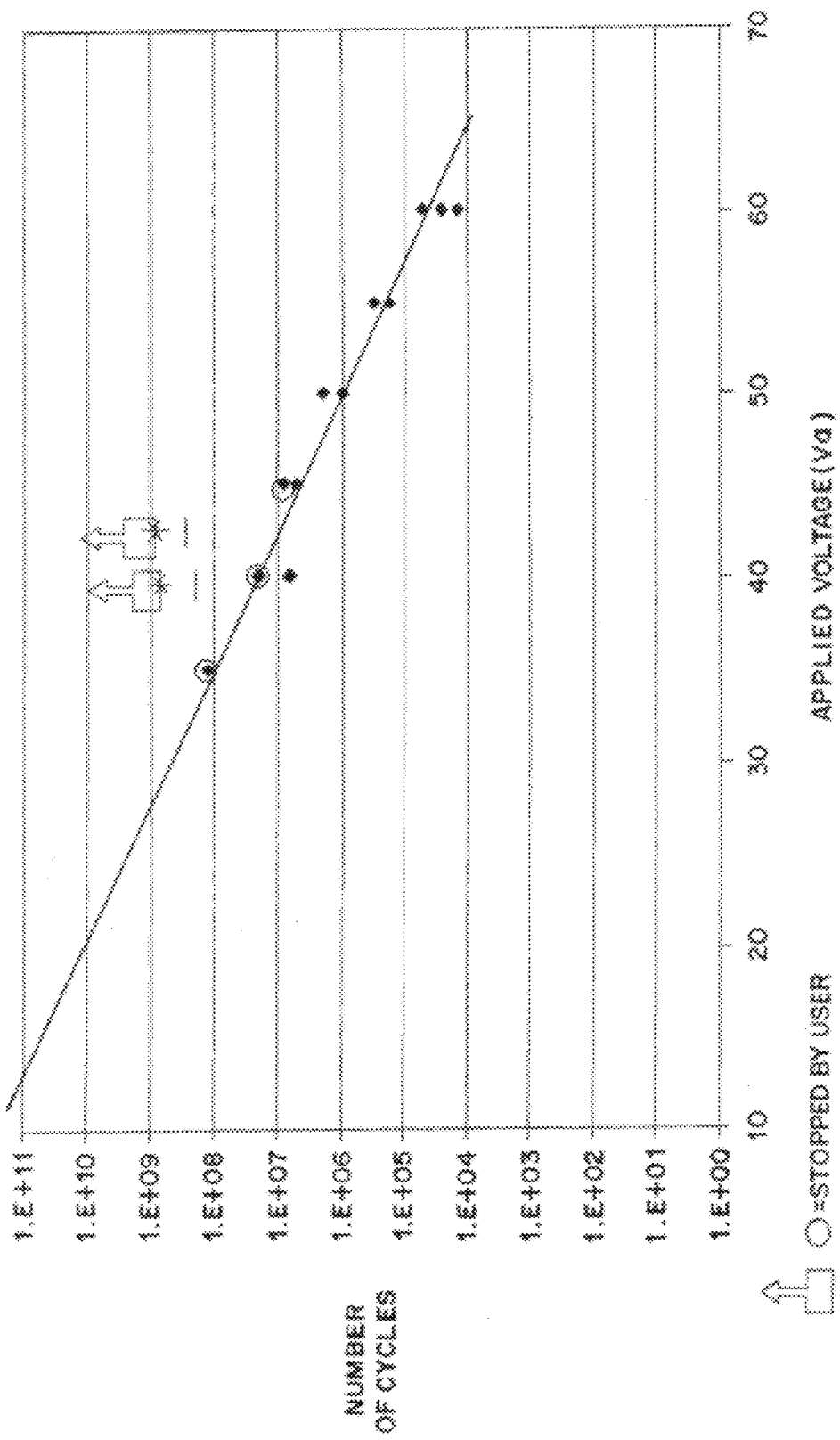
FIG. 32 is a diagram and chart illustrating number of cycles as a function of applied voltage and showing that UNCD based RF MEMS switches exhibit superior lifetime as compared to silicon nitride ($Si_3N_4$) based switches.

FIG. 32 is a diagram and chart illustrating number of cycles as a function of applied voltage and showing that UNCD based RF MEMS switches exhibit superior lifetime as compared to silicon nitride ($Si_3N_4$) based RF MEMS switches.

Figure 33:
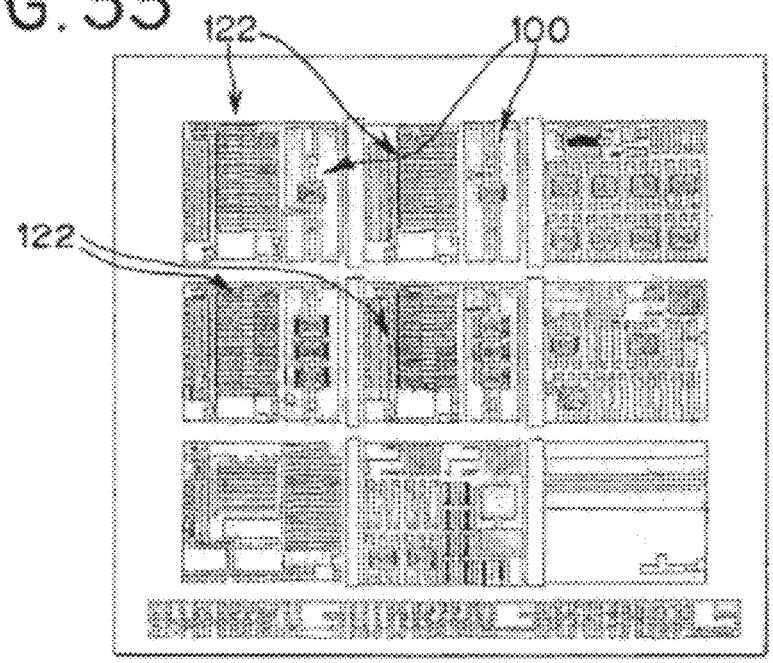
FIG. 33 is a diagram illustrating monolithically integrated RF MEMS capacitive switches/silicon on sapphire (SOS)-CMOS devices fabricated and tested using layered. UNCD dielectric films.
Figure 34:
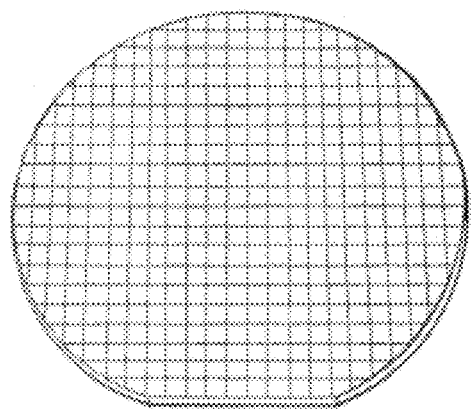
FIG. 34 is an image of a SOS CMOS wafer.
Figure 35:
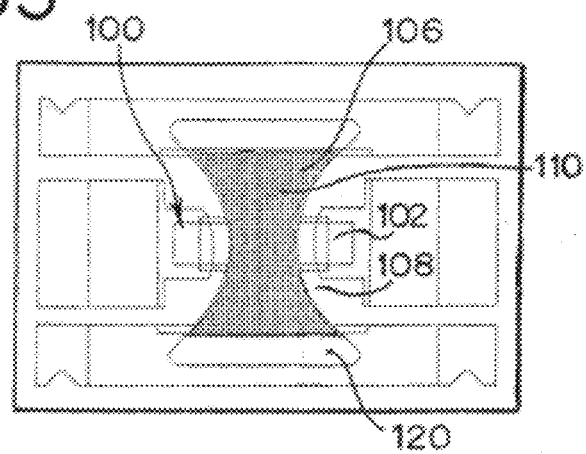
FIG. 35 is a top plan view of a RF MEMS capacitive switch.

FIG. 33 is a diagram illustrating monolithically integrated RF MEMS capacitive switches/silicon on sapphire (SOS)-CMOS devices fabricated and tested using layered UNCD dielectric films. In FIG. 33 at different places, there were four CMOS drive circuits, two RF MEMS capacitive switches, four MEMS test structures, two MEMS 1-bit phase shifters and one CMOS test structure. FIG. 34 is an image of a silicon on sapphire (SOS) CMOS wafer. The die size was 10.1 mm×10.1 mm. The die includes CMOS driver circuits, CMOS test structures. MEMS switches and 1-bit phase shifter, as well as MEMS test structures. The 150 mm wafer contained 130 dies. FIG. 35 is a top plan view of a RF MEMS capacitive switch.

Figure 36:
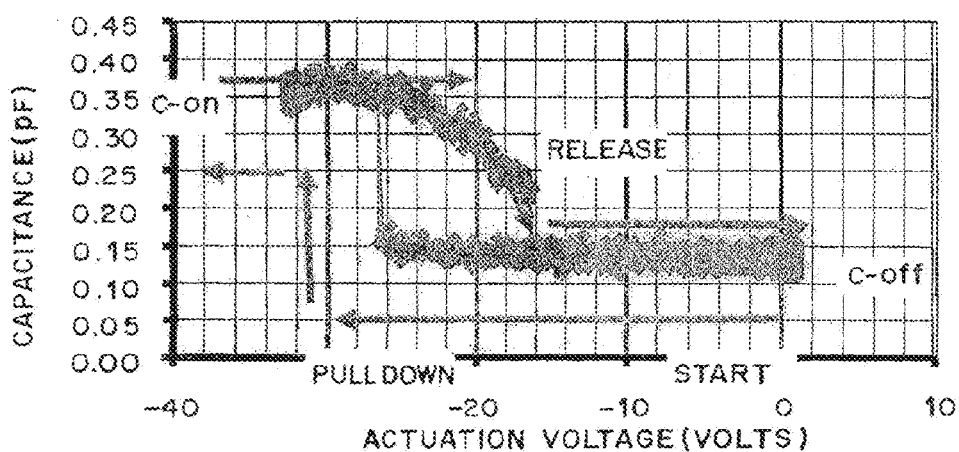
FIG. 36 is a diagram and chart of a bipolar pulsed actuation curve illustrating capacitance as a function of actuation voltage of a UNCD based monolithically integrated fully functional RF MEMS capacitive switches driven by CMOS.

FIG. 36 is a diagram and chart of a bipolar pulsed actuation curve illustrating capacitance as a function of actuation voltage of a UNCD based monolithically integrated fully functional RF MEMS capacitive switches driven by CMOS. The CMOS wafer was diced. The circuitry was tested for functionality and successfully worked for 85 million cycles.

Figure 37:
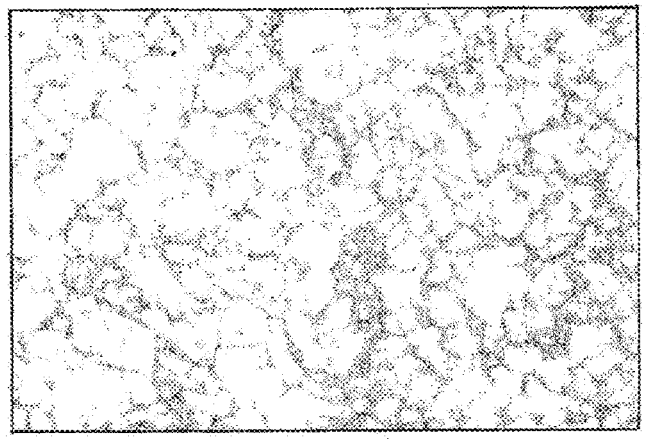
FIG. 37 is an image of prior nanocrystalline diamond film grown at high temperature of 800° C. and which is not compatible with CMOS.
Figure 38:
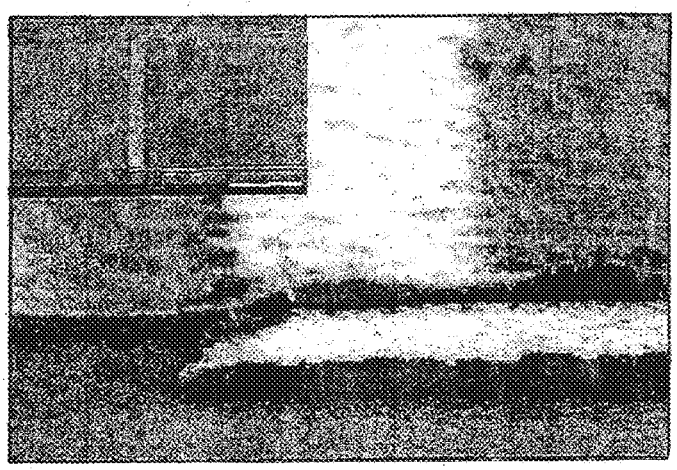
FIG. 38 is an image of a fabricated metal-insulator-metal (MIM) capacitor with diamond as well as chromium (chrome) (Cr)/platinum (Pt) and titanium (Ti)/gold (Au).

FIG. 37 is an image of prior nanocrystalline diamond film grown at high temperature of 800° C. and which is not compatible with CMOS, FIG. 38 is an image of a fabricated metal-insulator-metal (MIM) capacitor with diamond as well as chromium (Cr)/platinum (Pt) and titanium (Ti)/gold (Au).

The deposition parameters of the diamond film are shown in Table 1.

TABLE 1

| DEPOSITION PARAMETERS OF THE DIAMOND FILM | | |
|---|---|---|
| Process Parameter | BEN | Growth |
| Gas flow rate ($CH_4$:$H_2$) [sccm] | 10:200 | 2:200 |
| Plasma Power [W] | 300 | 300 |
| Pressure [torr] | 15 | 15 |
| Substrate Bias [V] | −250 | −125 |

Diamond growth a high temperatures, such as 800° C., are not compatible with CMOS.

The insertion loss of coplanar waveguide (CPW) of three material configurations for diamond, silicon dioxide ($SiO_2$) are silicon (Si) are shown in Table 2. This was done on MIM capacitors.

TABLE 2

| INSERTION LOSS OF CPW ON THREE MATERIAL COFIGURATIONS | | | |
|---|---|---|---|
| Frequency (GHz) | (i) (dB/cm) | (ii) dB/cm | (iii) (dB/cm) |
| 10 | 1.2 | 1.4 | 1.0 |
| 30 | 1.7 | 1.8 | 1.4 |
| 65 | 2.6 | 2.3 | 2.1 |

The ultrananocrystalline diamond (UNCD) thin films incorporated into RF MEMS capacitive switches can be deposited using microwave plasma chemical vapor deposition (MPCVD) and hot filament chemical vapor deposition (HFCVD) techniques. In both cases, UNCD films can be deposited at moderate substrate temperatures of 500° C.-680° C. The MPCVD grown UNCD films were produced in a 915 MHz MPCVD system installed in the Center for Nanoscale Materials at Argonne National Laboratory using a DiamoTek 1800 series brand 915 MHz, 10 KW MPCVD system from Lambda Technologies, Inc.

A special process can involve using seeding pretreatment followed by UNCD deposition using Ar/$CH_4$/$H_2$ gas chemistry to achieve diamond films with specific dielectric properties. The UNCD nucleation and growth process can result in a unique film microstructure with equiaxed 3 nm-5 nm grains and 0.4 nm wide grain boundaries.

A TEM micrograph has been made of ~230 nm thick UNCD film deposited on the 150 mm diameter quartz wafer used for incorporation into RF MEMS capacitive switches.

Characterization of the UNCD film using Raman spectroscopy and near edge x-ray absorption fine structure spectroscopy (NEXAFS) revealed that the UNCD film is high quality with very high percentage (98%) of sp3 bonded carbon. The UNCD synthesis parameters can be optimized to achieve films on quartz substrates with excellent thickness uniformity such as with a variation in thickness of ±5% from center to edge across 150 mm diameter substrates.

The improved process can comprise substituting new materials for the substrate and the lower electrode to accommodate the higher deposition temperature of diamond (>400° C.) relative to silicon dioxide (<100° C.). The substrate material can be changed from borosilicate glass (Pyrex) to quartz and sapphire. Both substrates permit higher process temperatures, and sapphire substrates enable the RF MEMS capacitive switch process to be compatible with silicon-on sapphire (SOS) electronics for CMOS-MEMS co-integration. Additionally, the standard chrome/gold (Au)/chrome metal stack for the lower electrode was replaced with a stack comprising chrome (chromium) (Cr)/tungsten (W)/chrome. This new electrode stack was designed to withstand higher deposition temperatures without significant metal migration or diffusion. To compensate for the fact that tungsten has a resistivity more than double that of gold, the tungsten film thickness was doubled to be approximately 0.5 μM thick. This helps maintain the switch insertion loss at a low level.

The 3-layer UNCD step approach can improve the dielectric properties as well as control internal stress in the dielectric films. The hydrogen bonding present at the grain boundary can help discharge charges accumulated in the dielectric layer rapidly, resulting in a fast recovering of the switch ($\leq 80$ μsec) and thereby practically eliminating failure due to charging. This process provides an improved RF MEMS capacitive switch with 5-6 times order of magnitude improvement in the charging-discharging characteristics of the RF MEMS capacitive switch with UNCD dielectric layers over conventional prior art RF MEMS capacitive switch with silicon dioxide ($SiO_2$) and silicon nitride ($Si_3N_4$) materials as dielectric layers.

RF MEMS capacitive switches can be fabricated with an insulating layer which comprises a dielectric film that is positioned on top of the electrode. Significantly, the dielectric film has electrical leaky characteristics and has properties optimized to enable a reliable, long-life ($\geq 100$ billion cycles) operation of the RF MEMS capacitive switch. Preferably, the material used as a leaky dielectric comprises ultrananocrystalline diamond (UNCD) developed in thin film form. Desirably, the UNCD dielectric film has sufficiently short discharging time constants that no matter how much charges are accumulated in the dielectric layer, the RF MEMS capacitive switch will recover quickly enough so as to be available for proper operation within a relatively short time span (microseconds to tens or hundreds of microseconds).

Generally, insulating materials for conventional prior art RF MEMS capacitive switches are engineered to avoid dielectric charging and fail very slowly. However, once failure occurs, the recovery time for the switch to be operational again is very long, essentially resulting in permanent failure of the switch and the system in which it is inserted, as a critical component. With this invention, the RF MEMS capacitive switch with a UNCD dielectric film can experience what colloquially is named and sometime erroneously described as a "failure", but in reality is a short operational interruption (microseconds long), followed by a rapid recovery (in microseconds) to normal operation. In this instance, the so called "failure" of the switch, due to dielectric charging, is moot and the RF MEMS capacitive switch will operate very effectively despite the charging effect.

The improved radio frequency (RF) microelectromechanical systems (MEMS) capacitive switch has a quick switching time and can be moved from an off state to an on state. The RF MEMS capacitive switch can have: a lower electrode, an upper electrode, a membrane that is positioned between the electrodes, and a leaky dielectric layer that is position on the lower electrode. Significantly, the leaky dielectric layer has a discharging time that is substantially less than the switching time. In use, the membrane is spaced from the electrodes in the off state and the membrane contacts the dielectric layer when a voltage is applied across the electrodes in the on state.

The dielectric layers can have electrical leaky characteristics and can comprise an insulating layer. Desirably, the dielectric layers are chemically inert and hydrophobic to substantially prevent tribiological interaction of the membrane with the dielectric layers. Preferably, the dielectric layers comprise ultrananocrystalline diamond (UNCD). The dielectric layers can comprises film with a grain size of about 3 nm to about 5 nm.

Advantageously, the RF MEMS capacitive switch can recover quickly in a period of time ranging from 1 microsecond to 100 microseconds from an accumulation of electrically charged particles on the insulating layer. The RF MEMS capacitive switch is designed and arranged to prevent it from failing due to rapid discharging of the dielectric layer. Desirably, the RF MEMS capacitive switch can operate with a discharging time less than 50-100 microseconds and is operable for over 100 billion cycles.

The inventive RF MEMS capacitive switch provides improved reliability. Advantageously, the switch dielectric is designed to have a discharging time constant which is short relative to the required switching time of the device. Since a well-designed micromechanical switches typically change state in less than 50 microseconds, it is desirable to have any accumulated charge to dissipate within 50 microseconds.

Significantly, traditional failure of the insulator in prior art switches due to dielectric charging is irrelevant, as the inventive RF MEMS capacitive switch with a UNCD dielectric film recovers quickly enough to be ready for the next operating cycle. Desirably, the main failure mode for capacitive MEMS switches is circumvented by this invention and the RF MEMS capacitive switch will have a good reliability set by the mechanical characteristics of the UNCD dielectric film.

Further improvements can be achieved if the charging time constant is made as long as possible. This causes the switch to accumulate charge at a slower rate than one with a short time constant. Irrespective of the charging time constant, if the discharging time constant is made short enough, then an induced charge will quickly dissipate and the device will recover to normal operation very quickly.

In order to provide a long life and reliable RF MEMS capacitive switch with short discharging time constants, the RF MEMS capacitive switch uses a ultrananocrystalline diamond (UNCD) as the switch dielectric instead of conventional silicon oxide or nitride dielectrics. Due to the ultrasmall grain sizes (3-5 nm) characteristic of UNCD, the mean-free-path to conductive grain boundaries is very short, allowing any trapped charges to recombine very quickly. Measurements made on the charging time constants of UNCD demonstrate a charging time constant of approximately 100 microseconds.

While measurements of the specific discharging time constant can be difficult to quantify due to a variety of mitigating circumstances, in the inventive RF MEMS capacitive switch, full discharging has been demonstrated to be less than 50 microseconds for switch on-times as long as 0.5 seconds.

The paradigm, pattern or example of operation with the inventive RF MEMS capacitive switch is fundamentally different from that of a traditional capacitive switch. For RF MEMS capacitive switch with a UNCD dielectric film, the discharge time is in the range of microseconds, which is orders of magnitude shorter than for traditional prior art switches with a silicon oxide or silicon nitride dielectric.

Significantly, the RF MEMS capacitive switch has ultrananocrystalline diamond (UNCD) as the switch dielectric. The impact on electromechanical performance is minimal. However, these devices exhibit uniquely different charging characteristics, with charging and discharging time constants 5-6 orders of magnitude quicker than conventional materials. The RF MEMS capacitive switches with a UNCD dielectric layer (film) can provide devices which have no adverse effects of dielectric charging and can be operated near-continuously in the actuated state without significant degradation in reliability.

Characterization of the electromechanical switch properties typically includes measuring its dynamic operating curve. These properties were measured by sweeping bias voltage and measuring the capacitance of the device (C-V curves). These switches exhibit actuation voltages in the range of 30-45 volts with an on-capacitance ranging from 650 fF to 800 fF. The on-capacitance is primarily determined by the surface roughness of the lower electrode and the cleanliness of the sacrificial release process. The measured switch off-capacitance ranged from 90 fF to 105 ff, which includes 52 fF of transmission line capacitance. This means that the MEMS plate and fringing capacitance is approximately 38 fF-53 fF.

The DC I-V characteristics of the switch were also measured as part of this characterization. When actuated, 5-25 nA of leakage current flowed through the switch, depending heavily on the operating voltage. To date, there has not been any perceived correlation between UNCD leakage current and the charging properties of these switches.

The RF performance of this switch is typical of most MEMS capacitive switches. When the shunt switch is in the off-state, the insertion loss is very low, on the order of 0.25 dB at 20 GHz. This is slightly higher than the usual insertion loss of 0.15 dB, and is attributed to the less conductive metal for the lower electrode. When the switch is actuated, isolation is set by the on-capacitance of the device. With 700 fF of on-capacitance, the isolation at 20 GHz is very close to the theoretical value associated with a shunt 700 fF capacitor (7.7 dB). This switch operates more like a switched capacitor (45 fF-725 fF) than a high isolation switch at frequencies below 20 GHz.

Traditional switch dielectrics such as $SiO_2$ and typically have bulk charging and discharging time constants of 10 to 100+ microseconds. As the switches operate, charges build up within their dielectric, and they experience a very gradual change in pull-in and release voltages until the ultimate failure of the switch. With bulk charging, this failure is characterized by the release voltage dropping to zero and the device becoming stuck down. After failure, the switch requires a sufficiently long period of time to recover (in which the charges recombine) before it is able to release.

After careful measurements, it was determined that switches with UNCD dielectrics have time constants that are 5-6 orders of magnitude quicker than those of conventional materials, which are on the order of 100 μS. With these very short time constants, the switch fails very quickly, less than a millisecond after actuation. As is characteristic of bulk charging, the device becomes stuck down. However, after the switch bias is removed, the switch requires a very short time for the charges to dissipate and the switch to release. The switch recovery time is not the typical 5-10 μS switching speed, but is dependent on the amount of charging which occurred during and after failure. Therefore, the time required for recovery and release is dependent on the switch on-time.

The release time of the switch as a function of the transmitted RF power, is the switch on-time. The switch recovery time, $t^{OFF}$, can take many hundreds of microseconds depending on the switch on-time, $t^{ON}$. In the most extreme cases, switches required milliseconds to recover. The switch recovery time can be plotted as a function of on-time, but there can be a saturation effect to the induced charge, so the recovery time does not continue to grow significantly with extended switch on-time.

The reason for this uniquely different operation is that the charging and discharging time constants of the dielectric layer are very short. As the RF MEMS capacitive switch is actuated and charges, bulk charging aids in the actuation of the switch and there is no perceived difference in actuation time. However, the release of the switch is delayed until the accumulated charges have had sufficient time to recombine and/or dissipate. This has the effect of making the switch release time dependant on the switch on-time and subsequent dissipation of accumulated charges.

To better understand the charging phenomenon, pulsed s-parameter measurements can be measured to investigate the charging characteristics of the RF MEMS capacitive switch with a UNCD dielectric layer.

A voltage waveform can be used to study dielectric charging of the switches. First, a control voltage of $V^{ON} \geq 33$ V can used to pull in the switch and to charge the dielectric for different $t^{ON}$ times. Next, the control voltage is reduced to $V^{OFF}=0$ and, at 10 μs after the control voltage is reduced from $V^{ON}$ to $V^{OFF}$, the switch capacitance is sampled to see whether or not the switch is released. Usually, the mechanical release process takes less than 10 μs to complete. Therefore, if the switch is released, its capacitance should decrease significantly. Once the switch is confirmed to have been released, $V^{OFF}$ is incremented by 0.1 V for the next charging cycle, after $t^{OFF} \geq 20$ ms to ensure most of the charge is discharged and the switch returns to its pristine state at the beginning of the next charging cycle. This way, the cycles are repeated until the switch flits to release after 10 μs and the $V^{OFF}$ then is deemed the release voltage. The release voltage decreases monotonically from 13 V to 0 when the charging time is increased from 10 to 500 μs.

Because the magnitude of the release voltage decreases after charging, charging appears to be in the bulk instead of the surface of UNCD. By assuming the charge distributed in the bulk of UNCD has the same effect as a sheet charge in the middle of the film, the shift in release voltage can be fitted to the following formula:

$$\Delta V = (dQ_0/2\epsilon_0\epsilon_R)[1-\exp(-t^{ON}/\tau_C)]$$

where d is the UNCD thickness, $Q_0$ is the steady-state charge density, 0 is the vacuum permittivity, $\epsilon_R=5.2$ is the diamond film dielectric constant, and $\tau_C$ is the charging time constant. The measured release-voltage shift can be best fitted with $\tau_C=95$ μs and $Q_0=2\times10^{12}/cm^2$.

Table 3 lists the charge densities and time constants. These results are in contrast to charging in $SiO_2$ or $SiN_x$, which involves time constants on the order of 10 sec and charge density in the order of $10^{11}$ q/cm$^2$, under comparable fields of $10^6$ V/cm.

TABLE 3

Charge Density and Time Constant of UNCD Switches

| Wafer | Dielectric Thickness d (μm) | Dielectric Constant $\epsilon_R$ | Switch | Stress Voltage $V^{on}$ (V) | Charge Density Q0 ($10^{12}$/ cm$^2$) | Time Constant $\tau_c$ (ms) |
|---|---|---|---|---|---|---|
| 1 | 0.33 | 5.2 | 06C-0110 | +35 | 2.0 | 0.095 |

The measurements imply that the UNCD possesses very short charging and discharging time constants. Charge carriers are concentrated at the grain boundaries, and since the grains are nano-sized, they do not have far to travel to diffuse into or out of the dielectric. In essence, the switch pulls down and immediately charges to failure. However, when the applied voltage is removed, the charges leave the dielectric very quickly, depending on how long the switch was in the down position. It is easy to envision conditions under which the switch will recover from charging within a designated switching time interval (e.g. 50 μS). With this mode of operation, the switch will always recover fully from charging before the next switch operation ensues.

RF MEMS capacitive switches with UNCD dielectric layers can provide three order of magnitude quicker recovery times than conventional prior art RF MEMS capacitive switches. Switches left "on" for 100 seconds recovered back to their original condition in less than 50 μS. This implies that if switches are cycled off once out of every 100 seconds, they will be fully recovered from any effects of charging and are ready to be reused anew. This means that they only have to be turned off 0.00005% of the timeline to operate without charging failure. Continuous switch operation is now reasonably achievable for RF MEMS capacitive switches because of this invention.

The measured results for these switches demonstrate a new paradigm in switch operation, one that potentially alleviates the scourge of dielectric charging. Presently, film stresses are high and delamination is a common occurrence in conventional prior art RF MEMS capacitive switches. Furthermore, pin-hole effects have been experienced in conventional prior art RF MEMS capacitive switches and steps must be taken to reduce their occurrence.

RF MEMS capacitive switches have been fabricated with this new approach on 150 mm diameter complementary metal-oxide-semiconductor (CMOS)-on-sapphire wafers (FIGS. 13-15) to achieve monolithically integrated UNCD-based RF MEMS capacitive switches/CMOS. The performance has been successfully tested on the inventive RF MEMS capacitive switch driven by on-chip integrated CMOS.

FIGS. 13-15 illustrate images and photographs of 150 mm diameter CMOS-sapphire wafer with monolithically integrated UNCD RF-MEMS switch as shown in FIG. 1.

FIG. 36 shows the capacitance measurements taken on one of the RF MEMS capacitive switch as the RF MEMS capacitive switch closes and releases with the application of voltage. The operation of the switch is indicated by arrows as shown in the FIG. 36. As the voltages reaches to a minimum threshold pull down voltage, the molybdenum (Mo) membrane is pulled down to make physical contact with the UNCD dielectric layers forming an MIM (metal-insulator-metal) capacitor; this is called the "on state". This capacitor is designed to achieve sufficient capacitive conductance such that it can capacitively couple, or even short, the RF signal path of the lower electrode to the grounded upper metal membrane. When the applied voltage is released, the restoring force of the membrane metal spring is sufficient to return the membrane to its "off state".

FIG. 36 illustrates capacitance measurement for a RF MEMS capacitive switch driven by a complementary metal-oxide-semiconductor (CMOS) device in the wafer shown in FIGS. 13-15. The RF MEMS capacitive switch with UNCD dielectric lasted for about 87 millions cycles of on-off operations. This is the first demonstration of CMOS-driven RF MEMS capacitive switch based on diamond. The upper molybdenum (Mo) membrane, which forms the MIM capacitance also play an important role in the reliability of the RF MEMS capacitive switch since often times conventional prior art RF MEMS capacitive switch switches fail due to the mechanical failure of this membrane due to constant buckling action.

The deposition process helps solve the problem of films stress and achieving device yield better than 90% on a full 150 min diameter wafer, which is needed for commercialization.

This invention will be used in phased array high frequency radars, cell phones, etc.

The advantages of the inventive RF MEMS capacitive switches with UNCD layers over conventional technologies include the ability to work in harsh environment and high frequency switching with very short charging-discharging time with an improvement over 5-6 order of magnitude over conventional prior art RF MEMS capacitive switches using silicon dioxide ($SiO_2$) or silicon nitride ($Si_3N_4$) dielectric layers.

The incorporation of ultrananocrystalline diamond films as an insulating dielectric for RF MEMS switches has been demonstrated in this invention. The charging and discharging time constants for these films are on the order of 100 μS and 5-6 orders of magnitude faster than those of conventional insulating films. This enables switches to recover from the adverse effects of charging quickly enough that the impact can be made negligible. For the first time, this offers the possibility of operating capacitive MEMS switches that are almost continuously "on" without an adverse impact on switch reliability.

RF MEMS capacitive switches with ultra-short recovery times are provided. Tests of RF MEMS capacitive switches with a UNCD dielectric layer have shown order of magnitudes shorter discharging times with respect to RF MEMS switches using conventional silicon oxide or silicon nitride dielectric layers. RF MEMS capacitive switches with UNCD dielectric layers have been tested up to 12 billion cycles and show excellent performance.

This invention circumvents the traditional "dielectric charging" failure mode common to capacitive RF MEMS switches. This enables ultra-low loss, low power consumption, and especially linear operation of MEMS devices to be used in a manner that is repeatable and reliable.

RF MEMS capacitive switches with a UNCD dielectric layer (film) provide variable capacitors that can be used to control and route microwave and millimeter-wave signals. Uses and applications for the inventive RF MEMS capacitive switches can include phase shifters for electronically scanned antenna arrays and tunable filters for spectrum control and anti-jamming, RF MEMS capacitive switches can be used in military and commercial radar and communications systems.

RF MEMS capacitive switches with a UNCD dielectric layer can also be used in numerous applications which depend on reliable, immediately available performance: phase shifter for phase array antennas, cell phone communications, industrial automation, PC peripherals, automatic test equipment, medical devices, instruments and military/aerospace equipment. RF MEMS capacitive switches with a UNCD dielectric layer offer promise of cost effective, high performance devices over a wide range of applications, RF MEMS capacitive switches with a UNCD dielectric layer can operate in harsh environments with a much longer operating life.

Among the many advantages of inventive RF MEMS capacitive switches with a UNCD dielectric layer (film) and process for producing the same are:
1. A superior fabrication and deposition process for RF MEMS capacitive switches.
2. Compatible for integration with complementary metal-oxide-semiconductors (CMOS) electronics.
3. Superb monolithically integrated RF MEMS capacitive switches for use with CMOS electronic devices.
4. Excellent use with phase array antennas for radars and other RF communication systems.
5. Orders of magnitude better switching performance.
6. Higher durability in harsh environments.
7. Greater performance for military and commercial communications applications
8. Better Reliability,
9. Longer Life.
10. Shorter time constants.
11. Superior switch capabilities.
12. Outstanding performance.
13. User friendly.
14. Economical.
15. Efficient.
16. Effective.

Although embodiments of the invention have been shown and described, it is to be understood that various modifications, substitutions, and rearrangements of process steps, parts, components, and materials, as well as other uses of the RF MEMS capacitive switch and process, can be made by those skilled in the art without departing from the novel spirit and scope of this invention.

What is claimed is:

1. A process for fabricating a radio frequency (RF) microelectromechanical switch (MEMS) capacitive switch, comprising the steps of:
   providing a substrate;
   placing a bottom electrode on the substrate;
   depositing layers of ultrananocrystalline diamond (UNCD) thin film on the bottom electrode by microwave chemical vapor deposition (CVD) with a microwave CVD plasma gas comprising argon (Ar), methane ($CH_4$) and hydrogen ($H_2$) to form multilayered UNCD dielectric films including
      depositing a bottom UNCD layer on the bottom electron with $H_2$ flow for rapid nucleation of the UNCD and forming a substantially continuous dielectric film;
      depositing an intermediate UNCD layer on the bottom UNCD layer with a higher $H_2$ flow and forming a higher resistivity film with a hydrogen enriched grain boundary;
      depositing an upper UNCD layer on the intermediate UNCD layer with a lower $H_2$ flow than for the intermediate UNCD layer for dense nucleation of the UNCD to fill in the gaps or pinholes between grains and forming a substantially continuous layer;
   positioning a moveable metallic membrane above the multilayered UNCD dielectric film;
   positioning a top electrode above the membrane; and
   forming a long life RF MEMS capacitive switch with the multilayered UNCD dielectric film, membrane, electrodes and substrate so that the RF MEMS capacitive switch is operable for more than 100 billion cycles.

2. A process for fabricating a RF MEMS capacitive switch in accordance with claim 1 wherein:
   the layers are deposited with 400 sccm Ar and 1-2 sccm $CH_4$;
   the bottom layer is deposited with 5-8 sccm $H_2$;
   the intermediate layer is deposited with 14-16 sccm $H_2$; and
   the upper layer is deposited with 5-8 sccm $H_2$.

3. A process for fabricating a RF MEMS capacitive switch in accordance with claim 1 wherein the layers are deposited at a temperature ranging from 400-500° C.

4. A process for fabricating a RF MEMS capacitive switch in accordance with claim 1 where in the $H_2$ concentration is increased 4-5% by volume in the microwave CVD plasma for the intermediate layer and decreased by 1-2% by volume in the microwave CVD plasma for the upper layer.

5. A process for fabricating a RF MEMS capacitive switch in accordance with claim 1 wherein:
   the dielectric film comprises an ultra thin UNCD dielectric film ranging from 200-300 nm;
   discharging and leaking charges accumulated in the dielectric film and recovering the RF MEMS capacitive switch within at least 80 μsec; and
   substantially preventing failure of the RF MEMS capacitive switch due to dielectric charging of the film.

6. A process for fabricating a RF MEMS capacitive switch in accordance with claim 1 including substantially eliminating stiction and tribo-charging problems when the RF MEMS capacitive switch is closed and the membrane contacts the dielectric film.

7. A process for fabricating a RF MEMS capacitive switch in accordance with claim 1 wherein:
   the membrane comprises molybdenum (Mo);
   the bottom electrode comprises tungsten (W) or a stack comprising chromium (chrome) (Cr), tungsten and chromium;
   the bottom electrode is positioned on a substrate selected from the group consisting of silicon on sapphire (SOS) and a silicon wafer; and
   the RF MEMS capacitive switch is monolithically integrated with a complementary metal-oxide-semiconductor (CMOS) electronic device.

* * * * *